United States Patent
Sato et al.

(10) Patent No.: US 10,409,345 B2
(45) Date of Patent: Sep. 10, 2019

(54) PHASE CHANGE COOLING DEVICE AND PHASE CHANGE COOLING METHOD

(71) Applicant: NEC CORPORATION, Tokyo (JP)

(72) Inventors: Masanori Sato, Tokyo (JP); Minoru Yoshikawa, Tokyo (JP); Akira Shoujiguchi, Tokyo (JP); Arihiro Matsunaga, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 15/559,885

(22) PCT Filed: Mar. 17, 2016

(86) PCT No.: PCT/JP2016/001544
§ 371 (c)(1),
(2) Date: Sep. 20, 2017

(87) PCT Pub. No.: WO2016/152111
PCT Pub. Date: Sep. 29, 2016

(65) Prior Publication Data
US 2018/0059746 A1 Mar. 1, 2018

(30) Foreign Application Priority Data
Mar. 23, 2015 (JP) .................. 2015-059180

(51) Int. Cl.
*G06F 1/20* (2006.01)
*F28D 15/02* (2006.01)
(Continued)

(52) U.S. Cl.
CPC ......... *G06F 1/206* (2013.01); *F28D 15/0266* (2013.01); *F28D 15/06* (2013.01);
(Continued)

(58) Field of Classification Search
CPC . H05K 7/20836; F28D 15/0266; F28D 15/06; F28D 2021/0028; G06F 1/20
See application file for complete search history.

(56) References Cited

U.S. PATENT DOCUMENTS

2012/0291465 A1* 11/2012 Kashirajima ...... H05K 7/20818
62/126
2013/0291576 A1* 11/2013 Wada ................. G05D 23/1934
62/129

(Continued)

FOREIGN PATENT DOCUMENTS

| JP | 2009-193137 A | 8/2009 |
| JP | 2009-193245 A | 8/2009 |
| JP | 2012-243035 A | 12/2012 |

OTHER PUBLICATIONS

International Search Report dated May 31, 2016, in corresponding PCT International Application.

*Primary Examiner* — Frantz F Jules
*Assistant Examiner* — Nelson J Nieves
(74) *Attorney, Agent, or Firm* — Finnegan, Henderson, Farabow, Garrett & Dunner, L.L.P.

(57) ABSTRACT

With a phase change cooling device, it is difficult to obtain reliable high-efficiency cooling performance due to a change in heat exchange performance. Thus, a phase change cooling device according to the present invention includes: a heat receiving apparatus that houses a coolant; a sensor that acquires heat receiving apparatus coolant information that is information relating to a liquid-gas two-phase flow interface of the coolant housed in the heat receiving apparatus; a radiator that radiates heat of coolant vapor of the coolant heat-received and evaporated in the heat receiving apparatus, and recirculates liquefied coolant liquid to the heat receiving apparatus; a valve that controls a flow rate of the coolant liquid; and a control unit that controls a degree of (Continued)

opening of the valve, wherein the control unit controls, based on the heat receiving apparatus coolant information, a degree of opening of the valve in such a way that a liquid-gas two-phase flow interface of the coolant is located at an end part of the heat receiving apparatus in a vertical direction.

11 Claims, 18 Drawing Sheets

(51) Int. Cl.
    *F28D 15/06*     (2006.01)
    *G05B 15/02*     (2006.01)
    *G05D 7/06*     (2006.01)
    *H05K 7/20*     (2006.01)
    *F28D 21/00*     (2006.01)

(52) U.S. Cl.
    CPC ............ *G05B 15/02* (2013.01); *G05D 7/0676* (2013.01); *G06F 1/20* (2013.01); *H05K 7/20827* (2013.01); *H05K 7/20836* (2013.01); *F28D 2021/0028* (2013.01); *Y02D 10/16* (2018.01)

(56) References Cited

U.S. PATENT DOCUMENTS

| | | | |
|---|---|---|---|
| 2014/0251574 A1* | 9/2014 | Yatskov | F28D 1/0426 165/53 |
| 2015/0264836 A1* | 9/2015 | Ambriz | H05K 7/20181 361/679.46 |
| 2016/0223740 A1* | 8/2016 | Yokawa | G02F 1/133615 |
| 2017/0187592 A1* | 6/2017 | Ghosh | H04L 41/145 |
| 2017/0202108 A1* | 7/2017 | Torresin | H05K 7/20309 |
| 2017/0202114 A1* | 7/2017 | Davidson | H05K 7/20781 |
| 2017/0212561 A1* | 7/2017 | Ku | G06F 1/20 |

* cited by examiner

PHASE CHANGE COOLING DEVICE AND PHASE CHANGE COOLING METHOD

CROSS-REFERENCE TO RELATED PATENT APPLICATIONS

This application is a National Stage Entry of International Application No. PCT/JP2018/001544, filed Mar. 17, 2016, which claims priority from Japanese Patent Application No. 2015-059180, filed Mar. 23, 2015. The entire contents of the above referenced applications are expressly incorporated herein by reference.

TECHNICAL FIELD

The present invention relates to a phase change cooling device and a phase change cooling method, and particularly, relates to a phase change cooling device and a phase change cooling method that transport and radiate heat by means of a cycle of vaporization and condensation of a coolant.

BACKGROUND ART

With growth of a cloud service in recent years, a required information processing amount continues to increase. In order to process a huge amount of data, a data center having enhanced energy efficiency by putting servers and network devices into one place is operated in various areas. However, with increase of an information processing amount in a data center, a power consumption amount in the data center is also increasing.

A data center accommodates electronic devices such as a central processing unit (CPU) and an integrated circuit (Large Scale Integration: LSI). Since these electronic devices involve heat generation, an air conditioner is used to maintain an appropriate temperature inside the data center. However, with increase of an information processing amount, such an air conditioner also requires a huge amount of power.

Accordingly, there is an urgent need to reduce power for an air conditioner in order to cut down on running cost of a data center. As one of attempts to reduce power for an air conditioner, a method is developed whereby heat discharged from a rack, which is a casing for housing an electronic device, is transported to outdoor directly without using an air conditioner, and is radiated to outdoor air. Using such a method makes it possible to reduce air-conditioning power of a data center.

As a method of transporting heat discharged from a rack housing an electronic device to outdoor, a method of using a phase change phenomenon of a coolant is known, besides a method of using a pump to circulate cool water supplied from outside. In this method, a coolant is circulated by constant occurrence of an evaporation phenomenon caused when a coolant undergoes a phase change from a liquid phase to a gas phase, and a condensation phenomenon caused when a coolant undergoes a phase change from a gas phase to a liquid phase. This method of using the phase change phenomenon is characterized by having a large heat transport amount since latent heat of a coolant is used. Thus, this method is expected as a means for reducing power for an air conditioner of a data center.

PTL 1 describes an example of a phase change cooling device that uses a coolant circulation cycle caused by such a phase change phenomenon of a coolant.

A relevant cooling system for an electronic device described in PTL 1 includes an evaporator provided in a vicinity of a server. A cooling coil is provided inside the evaporator, and a liquid coolant flowing through inside the cooling coil deprives surroundings of vaporization heat and gasifies, by being evaporated by hot air generated from the server. The evaporator is provided with a temperature sensor that measures a temperature of air after hot air discharged from the server is cooled by the evaporator. An expansion valve for adjusting a supply flow rate of the coolant to be supplied to the cooling coil is provided at an inlet of the cooling coil. Then, based on a measured temperature by the temperature sensor, a degree of opening of the expansion valve is automatically adjusted.

In addition, return piping and supply piping are connected with the evaporator, and the return piping and the supply piping are provided with a cooling tower and a heat exchanger through on-off valves. Then, a configuration is made such that flow of the coolant is switched by the cooling tower and the heat exchanger, based on a temperature and a humidity of outdoor air.

CITATION LIST

Patent Literature

[PTL 1] Japanese Unexamined Patent Application Publication No. 2009-193245 (paragraphs [0020] to [0032])

SUMMARY OF INVENTION

Technical Problem

As described above, the relevant cooling system for an electronic device described in PTL 1 includes the cooling tower and the heat exchanger for heat radiation. Then, when a temperature of outdoor air is low and heat exchange performance of the cooling tower is large, control is performed in such a way that the coolant is flowed to only the cooling tower, and, conversely, when a temperature of outdoor air is high and heat exchange performance of the cooling tower is deficient, control is performed in such a way that the coolant is flowed to the heat exchanger as well. In this manner, by configuring the relevant cooling system of an electronic device to include redundant heat radiation ability, reliable cooling performance is achieved. However, a configuration including both a cooling tower and a heat exchanger for heat radiation results in an increase in capital expenditure (CAPEX), and thus, is limitedly employed in practice.

As described above, a phase change cooling device has a problem that it is difficult to obtain reliable high-efficiency cooling performance due to a change in heat exchange performance.

An object of the present invention is to provide a phase change cooling device and a phase change cooling method that solve a problem that it is difficult to obtain reliable high-efficiency cooling performance with a phase change cooling device due to a change in heat exchange performance, which is the problem described above.

Solution to Problem

A phase change cooling device according to the present invention includes: a heat receiving apparatus that houses a coolant; a sensor that acquires heat receiving apparatus coolant information that is information relating to a liquid-gas two-phase flow interface of the coolant housed in the heat receiving apparatus; a radiator that radiates heat of coolant vapor of the coolant heat-received and evaporated in the heat receiving apparatus, and recirculates liquefied coolant liquid to the heat receiving apparatus; a valve that controls a flow rate of the coolant liquid; and a control unit that controls a degree of opening of the valve, wherein the control unit controls, based on the heat receiving apparatus coolant information, a degree of opening of the valve in such a way that a liquid-gas two-phase flow interface of the coolant is located at an end part of the heat receiving apparatus in a vertical direction.

A phase change cooling method according to the present invention includes: acquiring coolant information that is information relating to a liquid-gas two-phase flow interface of a coolant housed in a container; generating coolant liquid by radiating heat of coolant vapor of a heat-received and evaporated coolant and liquefying the coolant; and controlling, based on the coolant information, a flow rate of the coolant liquid in such a way that a liquid-gas two-phase flow interface of the coolant is located at an end part of the container in a vertical direction.

Advantageous Effects of Invention

A phase change cooling device and a phase change cooling method according to the present invention are able to obtain reliable high-efficiency cooling performance, depending on heat exchange performance.

DESCRIPTION OF EMBODIMENTS

Exemplary embodiments of the present invention will be described below with reference to the drawings. Note that a direction of an arrow in each drawing indicates an example, but is not intended to limit a direction of a signal between blocks.

First Exemplary Embodiment

Figure 1:
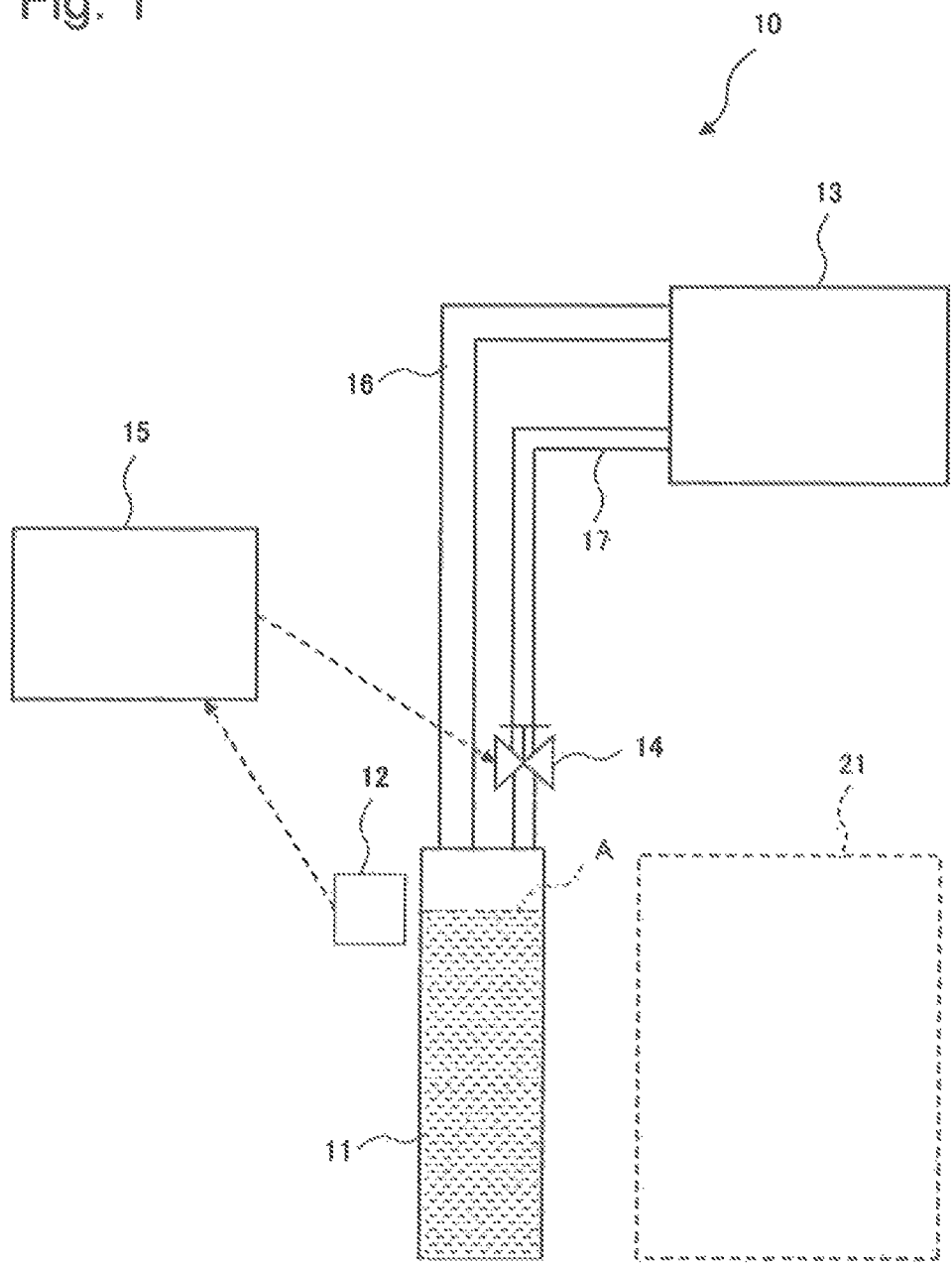
FIG. 1 is a side view schematically illustrating a configuration of a phase change cooling device according to a first exemplary embodiment of the present invention.
Figure 2:
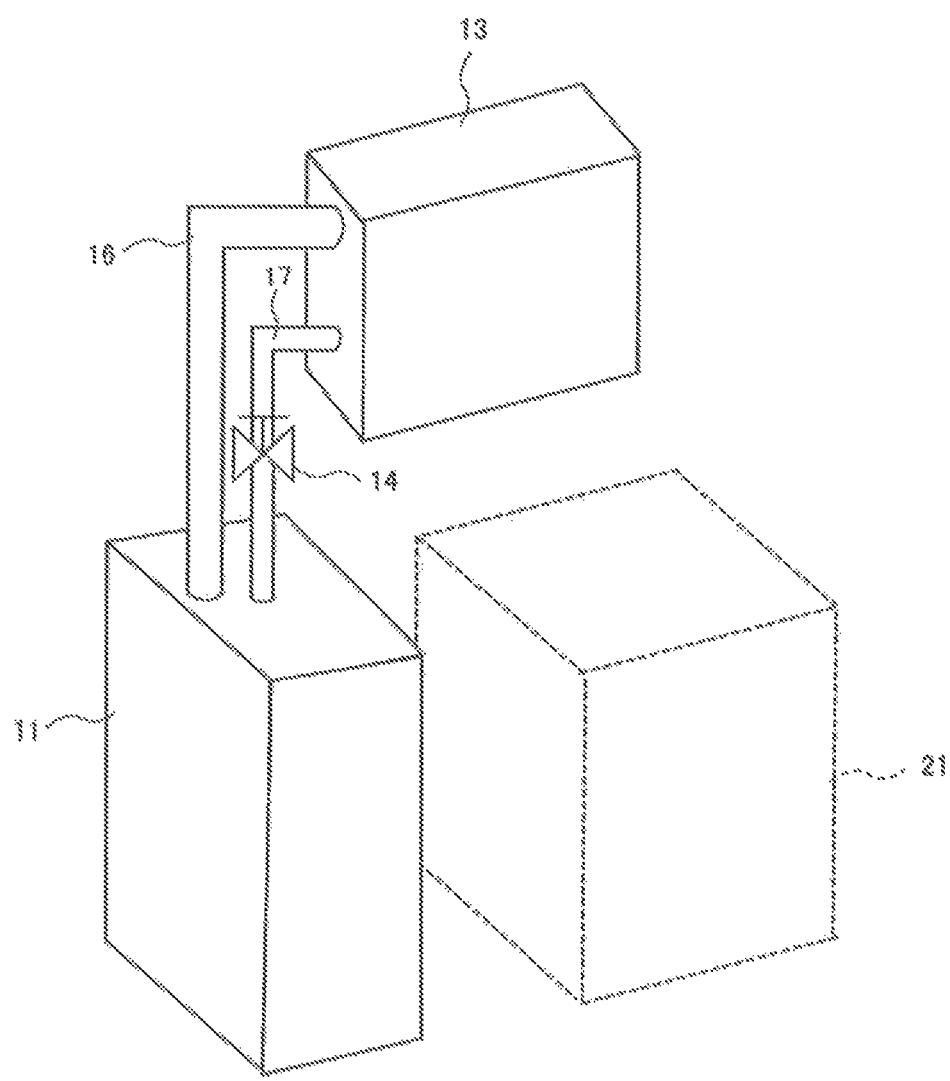
FIG. 2 is a perspective view schematically illustrating a part of the configuration of the phase change cooling device according to the first exemplary embodiment of the present invention.

FIG. 1 is a side view schematically illustrating a configuration of a phase change cooling device 10 according to a first exemplary embodiment of the present invention. FIG. 2 is a perspective view schematically illustrating a part of the configuration of the phase change cooling device 10 according to the present exemplary embodiment.

The phase change cooling device 10 according to the present exemplary embodiment includes a heat receiving apparatus 11 that houses a coolant, a sensor 12, a radiator 13, a valve 14, and a control unit 15.

The heat receiving apparatus 11 receives heat from blowing air warmed up by passing through a heating element 21 such as an electronic device as an object to be cooled, and deprives the blowing air of heat by means of vaporization of the coolant housed therein. The sensor 12 acquires heat receiving apparatus coolant information that is information relating to a liquid-gas two-phase flow interface A of the coolant housed in the heat receiving apparatus 11. The radiator 13 radiates heat of coolant vapor of the coolant heat-received and evaporated in the heat receiving apparatus 11, and recirculates liquefied coolant liquid to the heat receiving apparatus 11. The valve 14 controls a flow rate of the coolant liquid. Then, the control unit 15 controls, based on the heat receiving apparatus coolant information, a degree of opening of the valve 14 in such a way that the liquid-gas two-phase flow interface A of the coolant is located at an end part of the heat receiving apparatus 11 in a vertical direction. Herein, in a case illustrated in FIG. 1, the liquid-gas two-phase flow interface A of the coolant is an interface between a coolant in a gas-phase state and a coolant in a liquid-gas two-phase state. However, a liquid-gas two-phase flow interface of a coolant also includes an interface between a coolant in a liquid-phase state and a coolant in a liquid-gas two-phase state.

Note that, as illustrated in FIG. 1, a configuration may be made such that the heat receiving apparatus 11 and the radiator 13 are connected with each other by a vapor pipe 16 through which coolant vapor evaporated in the heat receiving apparatus 11 mainly flows and a liquid pipe 17 through which coolant liquid liquefied in the radiator 13 mainly flows. Herein, the valve 14 is arranged in a flow channel of the coolant liquid passing through the liquid pipe 17.

As described above, the phase change cooling device 10 according to the present exemplary embodiment uses a phase change cooling scheme that uses a phase change of a coolant. In this case, when a coolant in an amount for latent heat equivalent to a quantity of heat from the heating element 21 flows in the heat receiving apparatus 11, a maximum cooling efficiency in heat exchange performance of the heat receiving apparatus 11 and the radiator 13 at this time can be obtained. This is because an entire region of the heat receiving apparatus 11 is in a state in which heat absorption is performed by using only the latent heat of the coolant at this time. Accordingly, at this time, a liquid-gas two-phase flow interface of the coolant is located at an end part of the heat receiving apparatus 11 in a vertical direction.

As described above, the phase change cooling device 10 according to the present exemplary embodiment is configured such that the control unit 15 controls a degree of opening of the valve 14 in such a way that the liquid-gas two-phase flow interface A of the coolant is located at an end part of the heat receiving apparatus 11 in a vertical direction. Accordingly, the phase change cooling device 10 according to the present exemplary embodiment is able to obtain, even when heat exchange performance varies, reliable high-efficiency cooling performance, depending on heat exchange performance at the point of time.

Specifically, for example, a temperature sensor may be used as the sensor 12. The temperature sensor can be configured to measure an exhaust air temperature that is a temperature of blowing air passing through the healing element 21 as an object to be cooled, and is a temperature after being discharged from the heat receiving apparatus 11. In this case, the control unit 15 defines a blowing-air temperature difference that is a difference between the exhaust air temperature and a reference temperature, as being heat receiving apparatus coolant information. Then, when the blowing-air temperature difference is equal to or less than a determination value that is determined based on heat exchange performance of the heat receiving apparatus 11 and the radiator 13, the control unit 15 determines that a liquid-gas two-phase flow interface of the coolant is located at an end part of the heat receiving apparatus 11 in a vertical direction.

Next, a case in which a temperature sensor is used as a sensor included in the phase change cooling device according to the present exemplary embodiment will be described in further detail.

Figure 3:
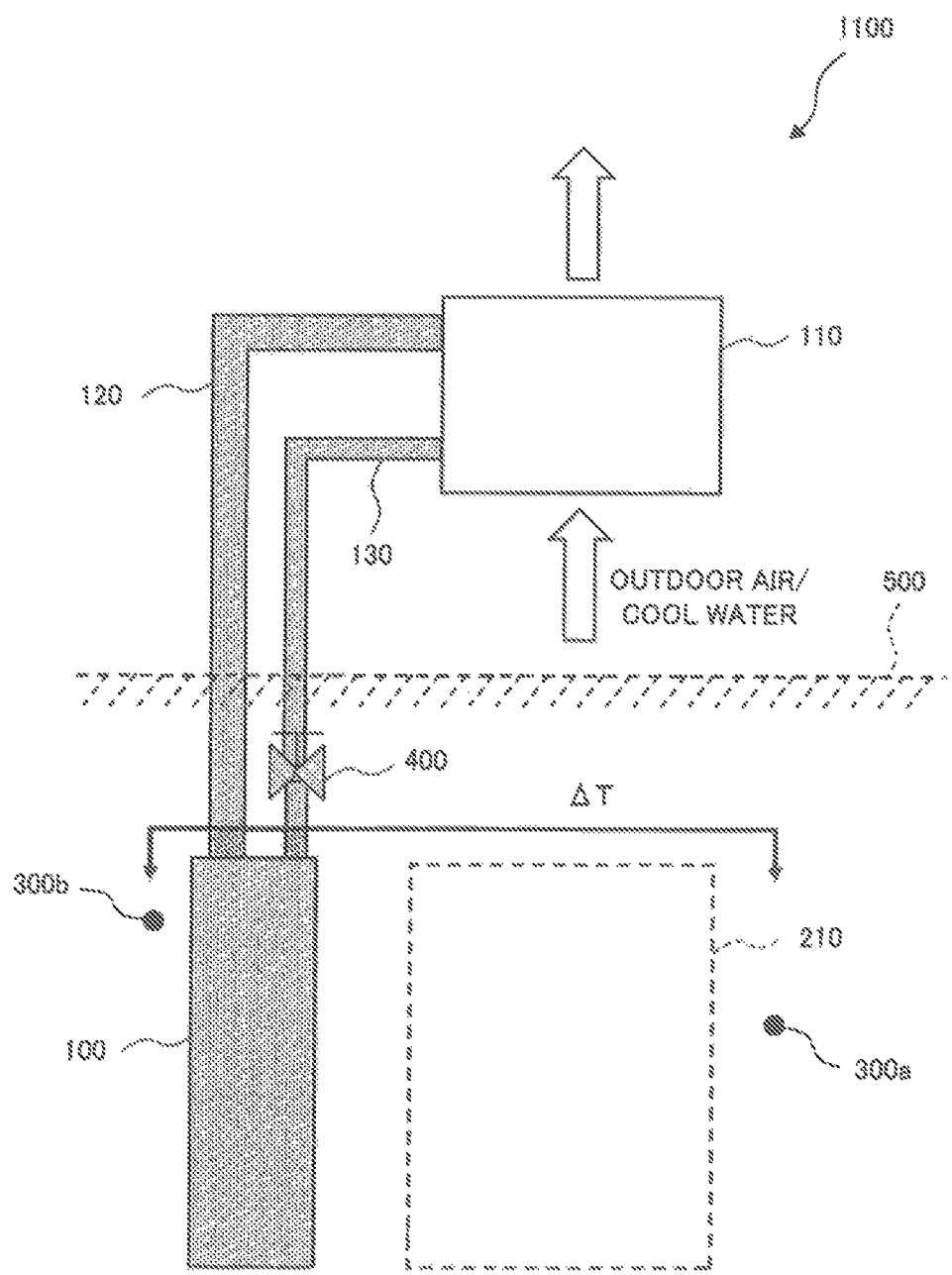
FIG. 3 is a side view schematically illustrating another configuration of the phase change cooling device according to the first exemplary embodiment of the present invention.
Figure 4:
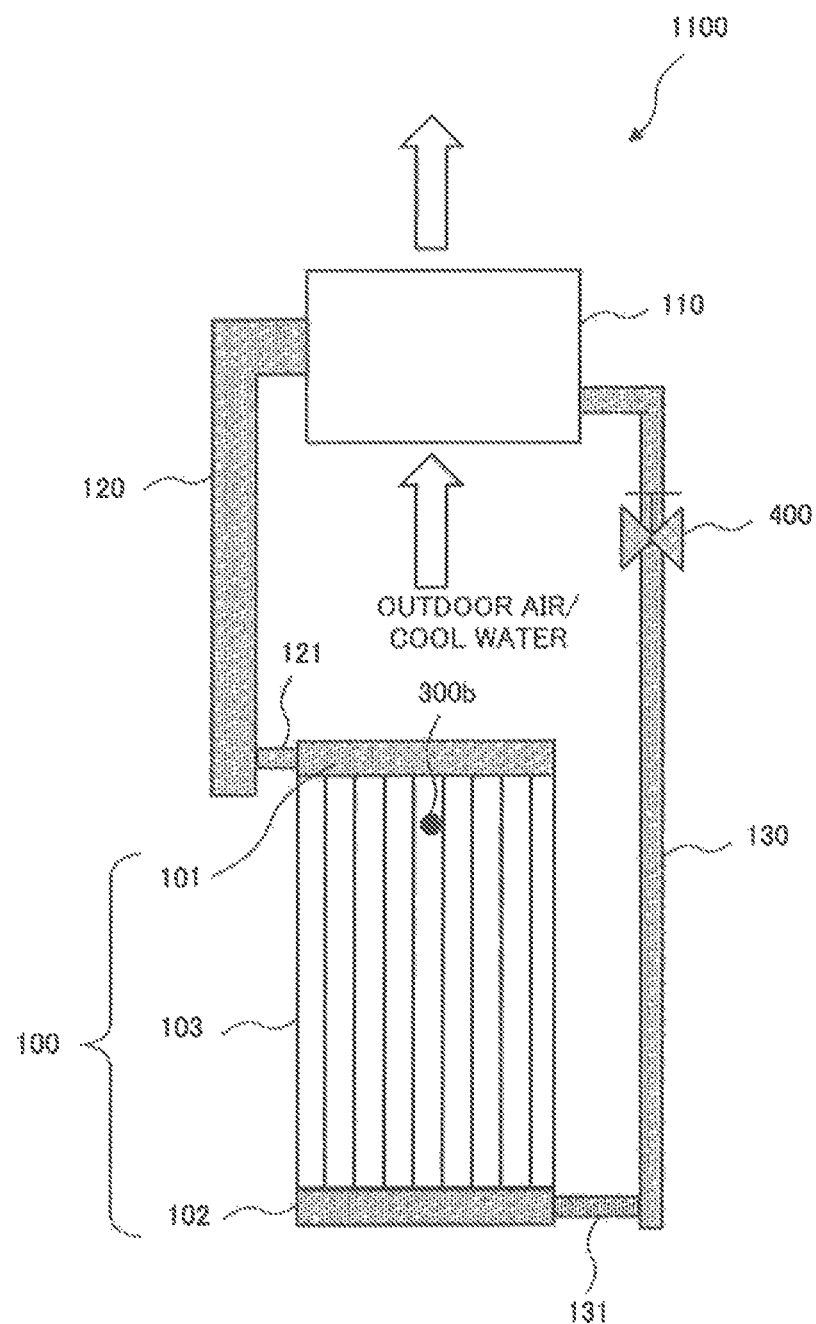
FIG. 4 is a front elevational view schematically illustrating the another configuration of the phase change cooling device according to the first exemplary embodiment of the present invention.

FIGS. 3 and 4 schematically illustrate a configuration of a phase change cooling device 1100 that uses a temperature sensor 300b as a sensor. FIG. 3 is a side view, and FIG. 4 is a front elevational view.

The phase change cooling device 1100 includes a heat receiving apparatus 100, a radiator 110, a vapor pipe 120, a liquid pipe 130, and a valve 400, and cools blowing air having passed through the electronic device 210.

The electronic device 210 is, for example, a server, a router, an uninterruptible power supply (UPS), and the like, and each of the above includes a heat-generating component such as a CPU and an LSI. The electronic device 210 performs various kinds of data processing, and an internal heat-generating component generates heat due to a load of the data processing. On an air intake side of the electronic device 210, a temperature sensor 300a that measures a temperature of blowing air before passing through the heat-generating component as a reference temperature is arranged, and the temperature sensor 300b is arranged on a side opposite to the electronic device 210 across the heat receiving apparatus 100.

The heat receiving apparatus 100 is disposed on a rear side of the electronic device 210. The heat receiving apparatus 100 is connected with the radiator 110 through the vapor pipe 120 and the liquid pipe 130. The heat receiving apparatus 100 contains a coolant hermetically sealed therein. The heat receiving apparatus 100 receives heat from the electronic device 210 via the coolant. At this time, the coolant liquid boils and undergoes a phase change to coolant vapor in a gas-phase state. The phase-changed coolant vapor moves to the radiator 110 through the vapor pipe 120 by means of buoyancy.

The radiator 110 radiates heat transported by the coolant vapor. In other words, the coolant vapor having flowed in through the vapor pipe 120 exchanges heat with water, air, and the like within the radiator 110. When water is used, warmed water is cooled by a chiller, a cooling tower, and the like, and is circulated by a pump, and the like. When heat is exchanged with air, air is fed to the radiator 110 by using a fan and the like, to thereby cool the coolant vapor. The cooled vapor condenses and undergoes a phase change to coolant liquid.

Herein, as illustrated in FIGS. 3 and 4, the radiator 110 is provided on a side above the heat receiving apparatus 100 and the electronic device 210. Specifically, for example, as illustrated in FIG. 3, a configuration may be made such that the radiator 110 is provided on a ceiling 500 of a living room such as an office. By disposing the radiator 110 on a ceiling in this way, a configuration may be made such that the heat receiving apparatus 100 is arranged on a side below the radiator 110 in a vertical direction, which makes it possible to use a natural circulation cooling scheme. Note that, when a pump and the like are used to circulate coolant liquid, an arrangement relationship is not limited to the above.

The coolant liquid generated in the radiator 110 descends through the liquid pipe 130 due to gravity, and recirculates to the heat receiving apparatus 100. Note that a pipe diameter of the vapor pipe 120 is desirably larger than a pipe diameter of the liquid pipe 130, since a volume of the coolant liquid increases by about 200 times when turning into vapor.

The coolant is composed of, for example, a polymeric material and the like, and is characterized by being evaporated in high temperatures and being liquefied in low temperatures. For the coolant, for example, a low-boiling point coolant such as Hydrofluorocarbon (HFC) and Hydrofluoroether (HFE) can be used.

The vapor pipe 120 and the liquid pipe 130 are formed of, for example, a metal such as an aluminum alloy, a rubber material, and the like. Note that, for connection of the vapor pipe 120 and the liquid pipe 130, a coupler, a flange, and the like are used.

Next, a configuration of the heat receiving apparatus 100 will be described in detail by using FIG. 4.

The heat receiving apparatus 100 is constituted of an upper header 101 and a lower header 102, hollow tubes 103 arranged therebetween, and a fin (not illustrated) provided between the tubes. The heat receiving apparatus 100 is coupled to the vapor pipe 120, through which coolant vapor phase-changed from coolant liquid flows, via a vapor branch pipe 121 on a side face of the upper header 101. In addition, the heat receiving apparatus 100 is coupled to the liquid pipe 130, through which coolant liquid flows, via a liquid branch pipe 131 on a side face of the lower header 102. Accordingly, coolant liquid is supplied into the tube 103 through the lower header 102. By changing a degree of opening of the valve 400 provided in the liquid pipe 130, coolant liquid at a flow rate corresponding to a quantity of heat passing through the heat receiving apparatus 100 can be supplied.

When exhaust heat of the electronic device 210 such as a server is absorbed by using a phase change of a coolant, a best cooling efficiency is obtained when the heat receiving apparatus 100 is supplied with a coolant at a flow rate for latent heat corresponding to a heat generation quantity, as described above. The reason is that, in a case of a flow rate for equal to or less than latent heat, no phase change takes place due to shortage of an amount of coolant liquid on an upper side of the heat receiving apparatus 100 (on a downstream side of flow of a coolant), and not all of exhaust heat can be absorbed. In addition, in a case of a flow rate for equal to or greater than latent heat, an amount of coolant liquid becomes excessive, which results in liquid cooling using sensible heat. Thus, a heat absorption quantity per unit flow rate decreases, which prevents exhaust heat from being efficiently absorbed.

Next, an operation of the phase change cooling device 1100 according to the present exemplary embodiment will be described.

When the heat receiving apparatus 100 is supplied with coolant liquid at a flow rate for latent heat, a difference between measurement results of the respective temperature sensors 300a and 300b becomes minimum. In other words, in this state, the heat receiving apparatus 100 most efficiently absorbs heat generated by the electronic device 210, and thus, a degree of opening of the valve 400 at this time is an optimum degree of opening. It is assumed that a difference between measurement temperatures of the temperature sensor 300a and the temperature sensor 300b at this time is ΔTmin. When the heat receiving apparatus 100 is able to absorb all exhaust heat of the electronic device 210, in other words, when heat exchange performance of the heat receiving apparatus 100 is 100%, ΔTmin becomes zero (0).

In contrast to this, when a difference (ΔT) between measurement temperatures of the temperature sensor 300a and the temperature sensor 300b is greater than ΔTmin by a certain value or more, for example, by Tc (ΔT>ΔTmin+Tc), a control unit (not illustrated) determines that heat exchange performance of the heat receiving apparatus 100 has degraded. Then, the control unit estimates a liquid surface (flow rate) of a coolant in the heat receiving apparatus 100, and controls the valve 400 in such a way that the liquid surface (flow rate) becomes optimum. In other words, the control unit controls a degree of opening of the valve 400 in such a way that ΔT becomes minimum, and adjusts a flow rate of coolant liquid to be flowed into the heat receiving apparatus 100. By performing control in this way, even when a heat generation quantity of the electronic device 210 varies, the heat receiving apparatus 100 can be supplied with coolant liquid at a necessary flow rate by changing a degree of opening of the valve 400, which allows reliable cooling performance to be maintained.

The control unit may be arranged in a local server and the like disposed in a living room and the like. Without limitation thereto, a configuration may be made such that the control unit is provided on a cloud system.

A value of Tc described above indicates a range allowing degradation of cooling performance, and can be set depending on necessary cooling performance. The larger the value of Tc is, the more a range that does not need to be controlled is increased, and thus, the control becomes easy yet cooling performance degrades. On the other hand, the smaller the value of Tc is, the more a range to be controlled is increased, and thus, the control becomes difficult yet cooling performance can be prevented from degrading.

Herein, when a plurality of temperature sensors 300a are provided, a maximum value of temperatures measured by the plurality of respective temperature sensors 300a may be set as an intake air temperature. Alternatively, a minimum value or an average value of temperatures measured by the plurality of respective temperature sensors 300a may be set as an intake air temperature.

In addition, when a plurality of temperature sensors 300b are provided, a maximum value of temperatures measured by the plurality of respective temperature sensors 300b may be set as an exhaust air temperature of a heat receiving apparatus. Alternatively, a minimum value or an average value of temperatures measured by the plurality of respective temperature sensors 300b may be set as an exhaust air temperature of a heat receiving apparatus. However, when a maximum value is set as an intake air temperature in the temperature sensor 300a, a maximum value is set as a heat receiving apparatus exhaust air temperature similarly in the temperature sensor 300b, rather than a minimum value or an average value is set as an exhaust air temperature of a heat receiving apparatus. Likewise, when a minimum value or an average value is set as an intake air temperature in the temperature sensor 300a, a minimum value or an average value is set as an exhaust air temperature of a heat receiving apparatus similarly in the temperature sensor 300b.

A value of ΔTmin to be used for control varies depending on heat exchange performance of the heat receiving apparatus 100, the radiator 110, and the like. For example, when areas of the heat receiving apparatus 100 and the radiator 110 are increased, heal exchange performance is improved, and thus, cooling performance of a cooling system is improved. In addition, in a case of a configuration in which heat is exchanged with water by the radiator 110, when a temperature of water is lowered or when a flow rate is increased, heat exchange performance is also improved, and thus, cooling performance of a cooling system is improved. When the cooling performance is improved, the value of ΔTmin is decreased since it becomes possible to absorb a larger amount of heat of the electronic device 210. Conversely, when the cooling performance is decreased, the value of ΔTmin is increased.

Next, a method of determining a value of ΔTmin will be described. A value of ΔTmin can be determined by varying a degree of opening of the valve 400. Specifically, a valve degree of opening is varied from 0 to 100%, for example, with a step of 5%. At this time, when a degree of opening of the valve 400 is varied, circulation of a coolant changes and cooling performance changes as well. Thus, a blowing air temperature is measured by using the temperature sensor 300a and the temperature sensor 300b after waiting for a certain period of time until the cooling performance is stabilized. This process is performed for all degrees of opening of a valve, and a value of ΔTmin is determined from a difference between measurement values of the temperature sensor 300a and the temperature sensor 300b. The determination of ΔTmin may be performed by a prior experiment before attaching the phase change cooling device 1100 to the electronic device 210, or may be performed at a time of operation start of a cooling system that uses the phase change cooling device 1100.

Figure 5:
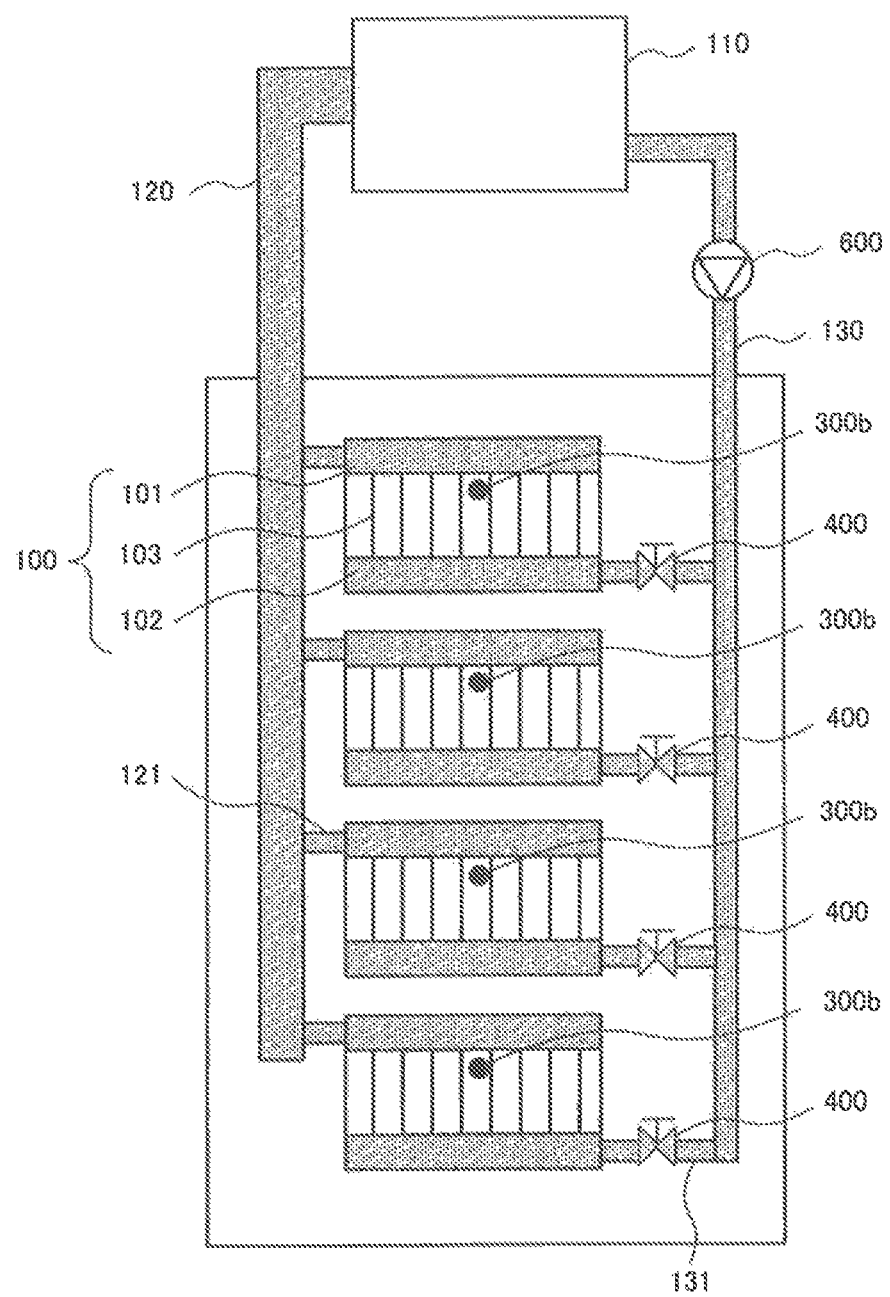
FIG. 5 is a front elevational view schematically illustrating still another configuration of the phase change cooling device according to the first exemplary embodiment of the present invention.

In the above-described exemplary embodiment, a configuration in which the phase change cooling device 1100 includes one heat receiving apparatus 100 has been described. Without limitation thereto, however, as illustrated in FIG. 5, a heat receiving apparatus may be constituted of a plurality of heat receiving apparatuses arranged in a vertical direction. Then, a configuration may be made such that each of the plurality of heat receiving apparatuses 100 includes the temperature sensor 300b and the valve 400. In this case, a pump 600 may be used to circulate coolant liquid.

In the above-described exemplary embodiment, a configuration in which the phase change cooling device 1100 uses the temperature sensor 300b as a sensor, and controls a degree of opening of the valve 400, based on a difference between measurement temperatures of the temperature sensor 300a and the temperature sensor 300b, has been described. Without limitation thereto, however, the phase change cooling device 1100 may control a degree of opening of the valve 400, based on power consumption of the electronic device 210 and a coolant flow rate. In other words, a configuration may be made such that power consumption of the electronic device 210 and a flow rate of a coolant are measured by using a power sensor and a flow rate sensor (flowmeter), respectively, and, from these measurement values, a valve degree of opening is controlled in such a way that the coolant at a flow rate corresponding to the power consumption is supplied.

Next, a phase change cooling method according to the present exemplary embodiment will be described.

In the phase change cooling method according to the present exemplary embodiment, first, coolant information that is information relating to a liquid-gas two-phase flow interface of a coolant housed in a container is acquired. In addition, coolant liquid is generated by radiating heat of coolant vapor of the heat-received and evaporated coolant and liquefying the coolant. Then, based on the coolant information, a flow rate of the coolant liquid is controlled in such a way that a liquid-gas two-phase flow interface of the coolant is located at an end part of the container in a vertical direction.

At this time, the coolant information can be defined as being a blowing-air temperature difference that is a difference between a reference temperature and an exhaust air temperature that is a temperature of blowing air passing through a heating element as an object to be cooled, and is a temperature after passing through the container. In this case, when the blowing-air temperature difference is equal to or less than a determination value that is determined based on heat exchange performance at a time when the coolant receives and radiates heat, determination is made that a liquid-gas two-phase flow interface of the coolant is located at an end part of the container in a vertical direction.

As described above, the phase change cooling device and the phase change cooling method according to the present exemplary embodiment are able to obtain reliable high-efficiency cooling performance, depending on heat exchange performance.

Second Exemplary Embodiment

Next, a second exemplary embodiment of the present invention will be described. A phase change cooling device according to the present exemplary embodiment has a configuration including a first temperature sensor and a second temperature sensor as sensors. Other configurations are the same as those in the phase change cooling device 1100 according to the first exemplary embodiment.

Figure 6:
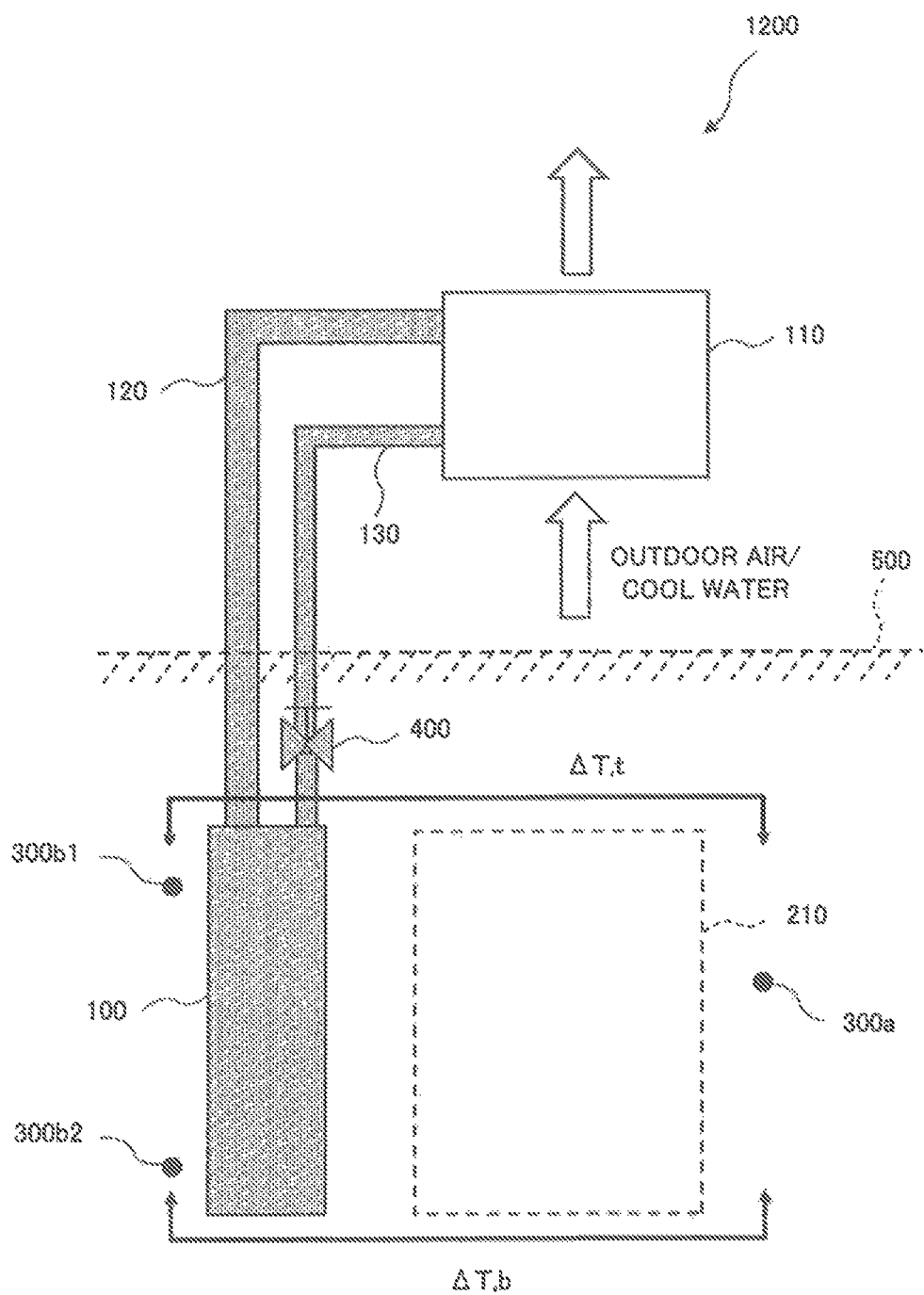
FIG. 6 is a side view schematically illustrating a configuration of a phase change cooling device according to a second exemplary embodiment of the present invention.
Figure 7:
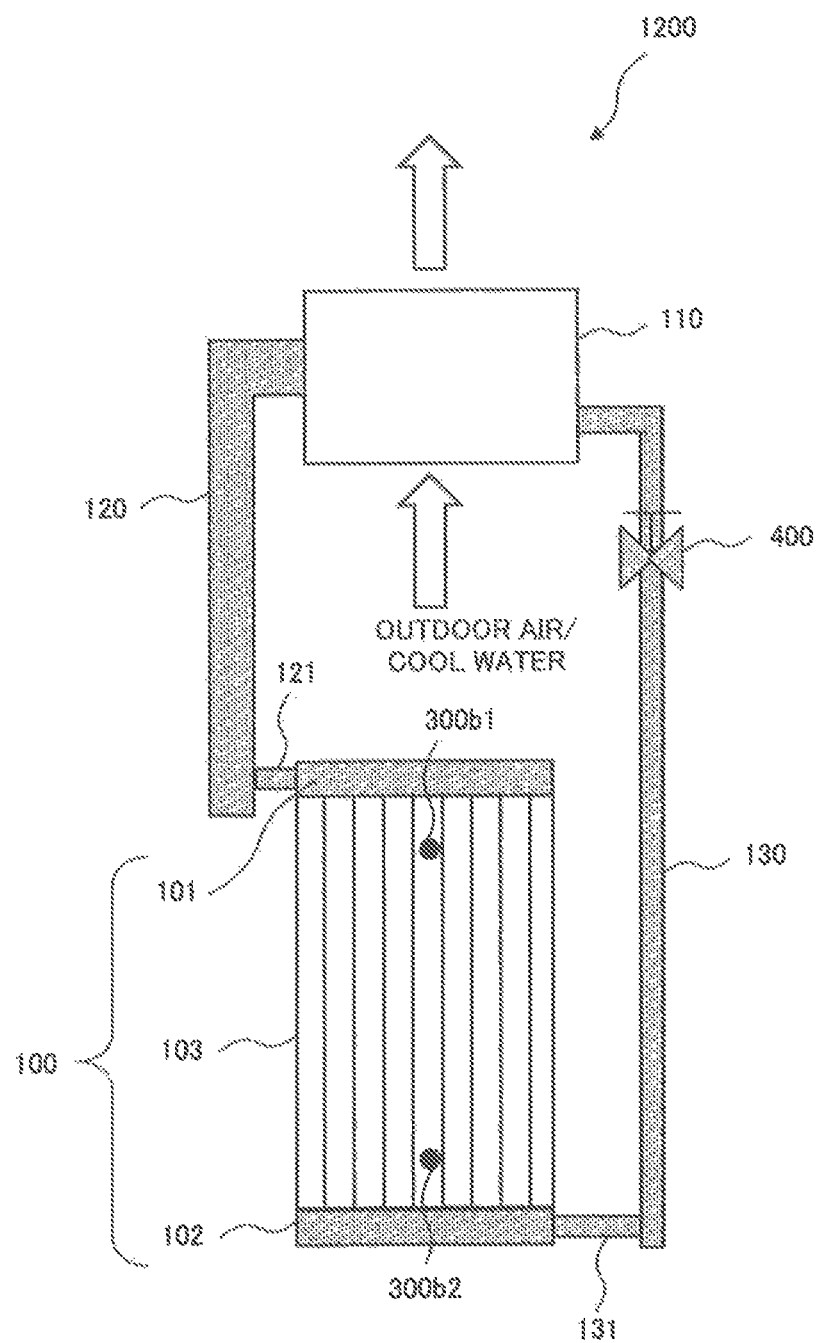
FIG. 7 is a front elevational view schematically illustrating the configuration of the phase change cooling device according to the second exemplary embodiment of the present invention.

FIGS. 6 and 7 schematically illustrate a configuration of a phase change cooling device 1200 that uses a first temperature sensor 300b1 and a second temperature sensor 300b2 as sensors. FIG. 6 is a side view, and FIG. 7 is a front elevational view.

As illustrated in FIG. 7, a heat receiving apparatus 100 is configured to flow in coolant liquid from a lower side in a vertical direction, and to flow out coolant vapor from an upper side in a vertical direction.

The first temperature sensor 300b1 is located on an upper side of the heat receiving apparatus 100 in a vertical direction (on a downstream side of flow of the coolant liquid), and measures a first exhaust air temperature that is an exhaust air temperature of the heat receiving apparatus 100. Then, the first temperature sensor 300b1 outputs the first exhaust air temperature as heat receiving apparatus coolant information to a control unit.

The second temperature sensor 300b2 is located on a lower side of the heat receiving apparatus 100 in a vertical direction (on an upstream side of flow of the coolant liquid), and measures a second exhaust air temperature that is an exhaust air temperature of the heat receiving apparatus 100. Then, the second temperature sensor 300b2 outputs the second exhaust air temperature as heat receiving apparatus coolant information to the control unit.

The control unit controls a degree of opening of a valve 400 in such a way that both a first blowing-air temperature difference that is a difference between the first exhaust air temperature and a reference temperature, and a second blowing-air temperature difference that is a difference between the second exhaust air temperature and the reference temperature, become equal to or less than a determination value.

Note that a configuration may be made such that the first temperature sensor 300b1 is arranged facing a heat-receiving region of the heat receiving apparatus 100 from which blowing air is discharged, and is located within a ten-percent range from an upper end of the heat-receiving region. In addition, a configuration may be made such that the second temperature sensor 300b2 is arranged facing a heat-receiving region of the heat receiving apparatus 100 from which blowing air is discharged, and is located within a ten-percent range from a lower end of the heat-receiving region.

Figure 8:
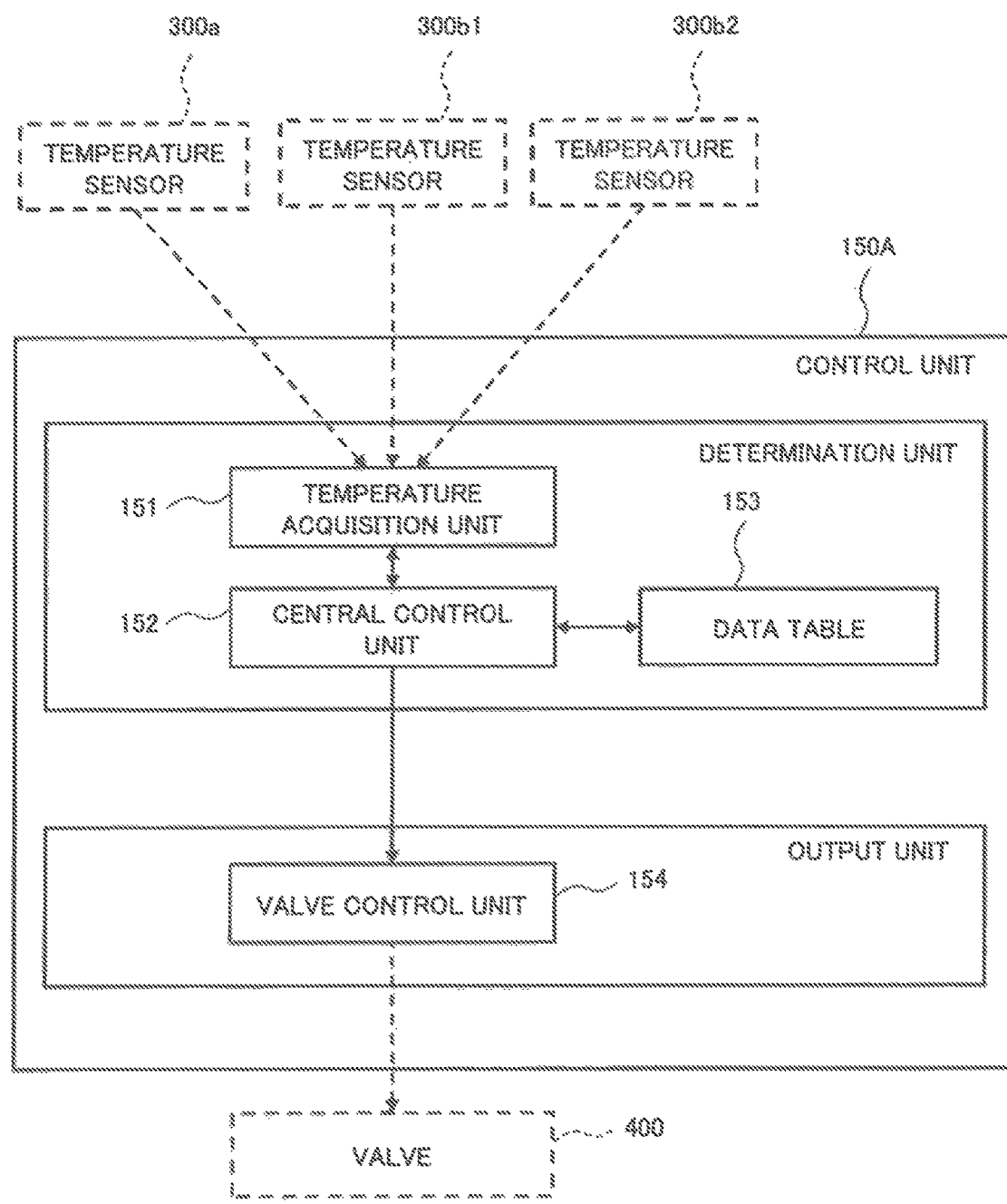
FIG. 8 is a block diagram illustrating a configuration of a control unit included in the phase change cooling device according to the second exemplary embodiment of the present invention.

FIG. 8 illustrates a configuration of a control unit 150A included in the phase change cooling device 1200 according to the present exemplary embodiment. The control unit 150A is constituted of a determination unit including a temperature acquisition unit 151, a central control unit 152, and a data table 153 as a storage unit, and an output unit including a valve control unit 154 that performs valve control.

Figure 9:
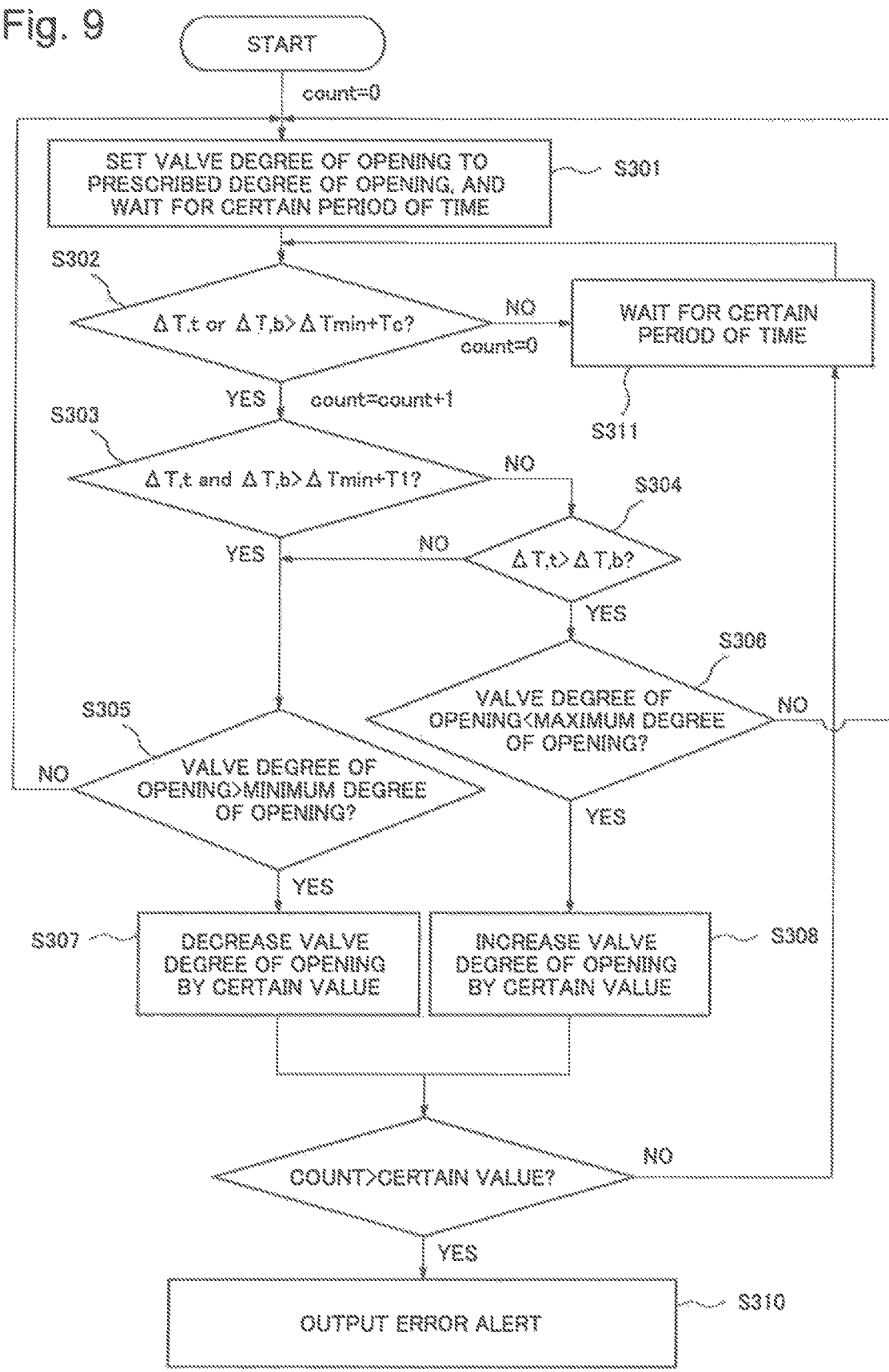
FIG. 9 is a flowchart for describing an operation of the phase change cooling device according to the second exemplary embodiment of the present invention.

Next, an operation of the phase change cooling device 1200 according to the present exemplary embodiment will be described. FIG. 9 is a flowchart for describing an operation of the phase change cooling device 1200 according to the present exemplary embodiment. Note that, in the following description, the first temperature sensor 300b1 and the second temperature sensor $300b2$ will be simply referred to as a temperature sensor $300b1$ and a temperature sensor $300b2$, respectively.

First, the control unit 150A starts an operation by setting a count of a counter to zero "0".

The central control unit 152 included in the control unit 150A extracts prescribed degree-of-opening data of the valve 400 from the data table 153, and passes the prescribed degree-of-opening data to the valve control unit 154. The valve control unit 154 changes, based on the prescribed degree-of-opening data, a degree of opening of the valve 400. Thereafter, the control unit 150A waits for a certain period of time, for example, for about one minute, until circulation of coolant liquid is stabilized (Step S301).

The data table 153 holds setting data such as ΔTmin, Tc, T1 to be described later, and a prescribed degree of opening, a minimum degree of opening, and a maximum degree of opening of a valve. A prescribed degree of opening of a valve is set to a degree of opening or the like that achieves an appropriate flow rate for an assumed heat generation quantity. The more accurate the prescribed degree of opening is, the shorter time it takes for control to converge, and time during which high cooling performance can be held is increased. T1 is a temperature to increase from a temperature difference ΔTmin that can be achieved when a flow rate for latent heat is supplied when a cooling system works with liquid cooling, and is set to, for example, 4° C. and the like. A maximum degree of opening is typically 100%, and a minimum degree of opening is, for example, about 5%.

After waiting for a certain period of time, the temperature acquisition unit 151 acquires data from a temperature sensor $300a$, and the temperature sensors $300b1$, and $300b2$. Hereinafter, it is assumed that a measurement value of the temperature sensor $300a$ is Ta, a measurement value of the temperature sensor $300b1$ is Tout,t, and a measurement value of the temperature sensor $300b2$ is Tout,b.

The central control unit 152 acquires values of Ta, Tout,t, and Tout,b from the temperature acquisition unit 151, calculates ΔT,t that is a value obtained by subtracting Ta from Tout,t, and ΔT,b that is a value obtained by subtracting Ta from Tout,b, respectively, and compares magnitude of ΔT,t and ΔT,b with ΔTmin+Tc, respectively (Step S302).

When both ΔT,t and ΔT,b are smaller than ΔTmin+Tc (Step S302/NO), the central control unit 152 determines that change of a degree of opening of the valve 400 is unnecessary. In this case, the count of the counter is set to 0, and the processing returns to Step S302 after waiting for a certain period of time (Step S311).

When either of ΔT,t and ΔT,b is larger than ΔTmin+Tc (Step S302/YES), the central control unit 152 determines that change of a degree of opening of the valve 400 is necessary. In this case, the central control unit 152 increments the count of the counter by 1, and compares magnitude of ΔT,t and ΔT,b with ΔTmin+T1, respectively (Step S303).

When both ΔT,t and ΔT,b are greater than ΔTmin+T1 (Step S303/YES), it can be determined that an entire region of the heat receiving apparatus 100 works with liquid cooling, and thus, the processing transitions to processing of decreasing a degree of opening of the valve (Steps S305 and S307).

When either of ΔT,t and ΔT,b is smaller than ΔTmin+T1 (Step S303/NO), the central control unit 152 determines that not the entire region of the heat receiving apparatus 100 works with liquid cooling. In this case, the central control unit 152 compares magnitude of ΔT,t with ΔT,b (Step S304). At this time, since not the entire region of the heat receiving apparatus 100 works with liquid cooling, a flow rate of a coolant is slightly less or slightly more than an optimum amount. When the flow rate of the coolant is slightly more than the optimum amount, an upstream side of flow of the coolant in the heat receiving apparatus 100 works with liquid cooling, and thus, ΔT,t<ΔT,b holds (Step S304/NO). On the other hand, when the flow rate of the coolant is less than the optimum amount, a liquid amount is small on a downstream side of flow of the coolant in the heat receiving apparatus 100 and a heat absorption quantity decreases, and thus, ΔT,t>ΔT,b holds (Step S304/YES).

In Step S304, when it is determined that ΔT,t is greater than ΔT,b (Step S304/YES), it can be determined that a liquid amount of the coolant liquid is small on a downstream side of flow of the coolant in the heat receiving apparatus 100. In this case, the control unit 150A determines whether or not a degree of opening of the valve 400 is equal to or less than a maximum degree of opening (Step S306). When it is determined that the degree of opening of the valve 400 is smaller than the maximum degree of opening (Step S306/YES), the degree of opening of the valve 400 is increased by a certain value (Step S308), and the flow rate of the coolant liquid to be supplied to the heat receiving apparatus 100 is increased.

When it is determined that the degree of opening of the valve 400 is equal to or greater than the maximum degree of opening (Step S306/NO), the processing returns to Step S301.

In Step S304, when it is determined that ΔT,t is equal to or less than ΔT,b (Step S304/NO), it can be determined that a liquid amount of the coolant liquid is excessive on a downstream side of flow of the coolant in the heat receiving apparatus 100. In this case, the control unit 150A determines whether or not a degree of opening of the valve 400 is greater than a minimum degree of opening (Step S305). When it is determined that the degree of opening of the valve 400 is greater than the minimum degree of opening (Step S305/YES), the degree of opening of the valve 400 is decreased by a certain value (Step S307). When it is determined that the degree of opening of the valve 400 is equal to or less than the minimum degree of opening (Step S305/NO), the processing returns to Step S301.

After the degree of opening of the valve 400 is decreased by a certain value (Step S307) or is increased by a certain value (Step S308), the control unit 150A determines whether or not the count of the counter is greater than a certain value, for example, 100 (Step S309). When the count is equal to or less than a certain value (Step S309/NO), the processing transitions to Step S302 after waiting for a certain period of time (Step S311).

When the count is greater than a certain value (Step S309/YES), the control unit 150A outputs an error alert (Step S310). This is because the count that is greater than a certain value indicates that a flow rate of coolant liquid has been uncontrolled for a long period of time. Such a phenomenon occurs when a coolant transport amount of a pump is insufficient or excessive, when a degree of opening cannot be adjusted due to occurrence of a trouble in the valve 400, or the like.

With the above-described operation of the control unit 150A included in the phase change cooling device 1200, even when a heat generation quantity of the electronic device 210 varies, the heat receiving apparatus 100 can be supplied with coolant liquid at a necessary flow rate by changing a degree of opening of the valve 400 in accordance with the above-described control method. Therefore, the phase change cooling device 1200 according to the present exemplary embodiment is able to obtain reliable high-efficiency cooling performance, depending on heat exchange performance. In particular, since a configuration is made such that two temperature sensors are disposed on an exhaust side of the heat receiving apparatus 100, the phase change cooling device 1200 according to the present exemplary embodiment is able to obtain the above-described effect in accordance with a control process with higher efficiency and a faster convergence speed.

Third Exemplary Embodiment

Next, a third exemplary embodiment according to the present invention will be described. A phase change cooling device 1300 according to the present exemplary embodiment has a configuration including, as a sensor, a third temperature sensor 300bu that is located on an upper side of a heat receiving apparatus in a vertical direction. In addition, a configuration of a control unit is different from that in the phase change cooling device 1200 according to the second exemplary embodiment. Other configurations are the same as those in the phase change cooling device 1100 according to the first exemplary embodiment illustrated in FIGS. 3 and 4.

As illustrated in FIG. 4, a heat receiving apparatus 100 is configured to flow in coolant liquid from a lower side in a vertical direction, and to flow out coolant vapor from an upper side in a vertical direction.

The third temperature sensor 300bu is located on an upper side of the heat receiving apparatus 100 in a vertical direction, and measures a third exhaust air temperature that is an exhaust air temperature of the heat receiving apparatus 100. Then, the third temperature sensor 300bu outputs the third exhaust air temperature as heat receiving apparatus coolant information to a control unit 150B. Note that, in the following description, the third temperature sensor 300bu will be simply referred to as a temperature sensor 300bu.

The control unit 150B performs control in such a way that a degree of opening of a valve 400 is stepwisely increased until a third blowing-air temperature difference that is a difference between the third exhaust air temperature and a reference temperature becomes equal to or less than a determination value.

Figure 10:
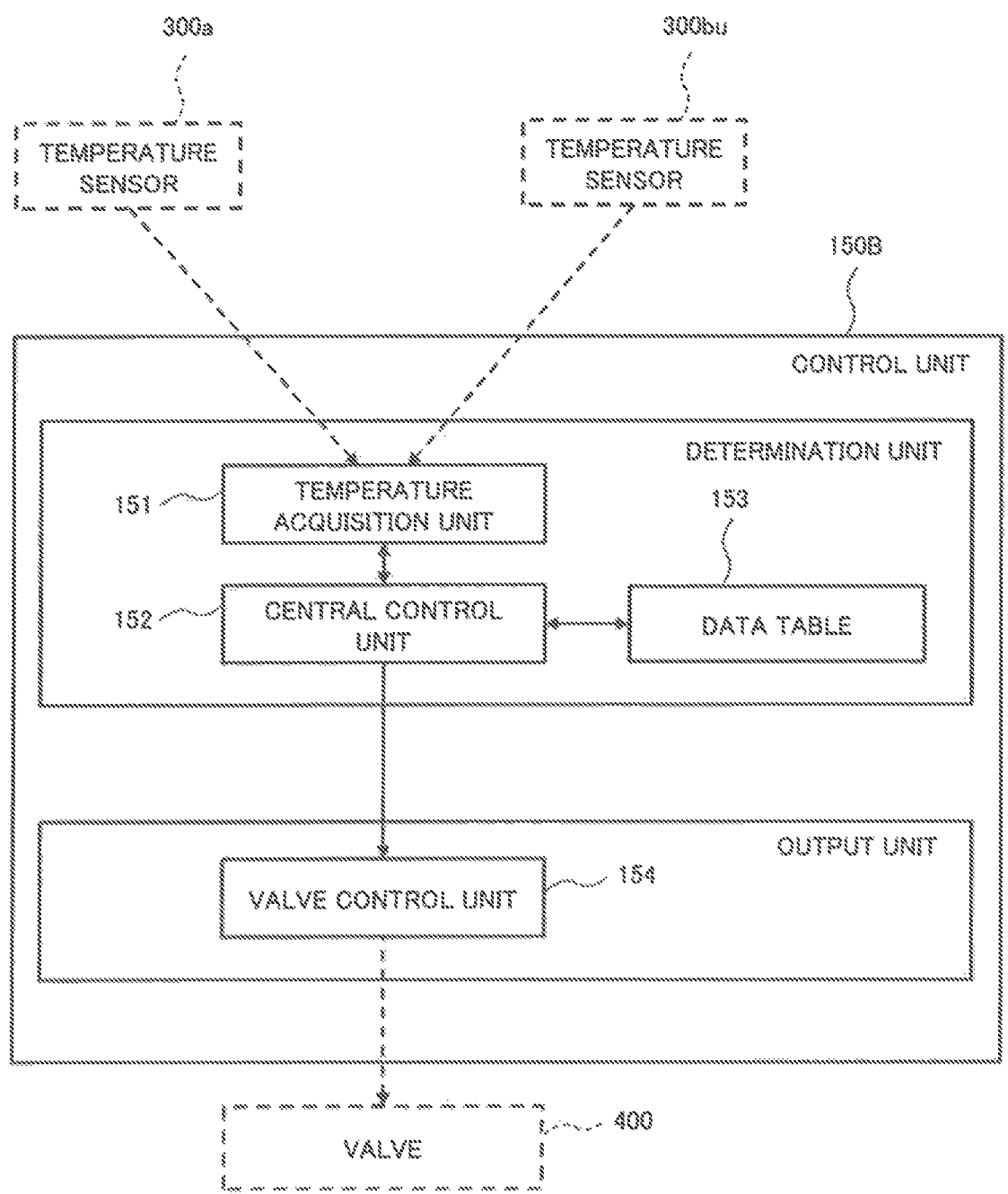
FIG. 10 is a block diagram illustrating a configuration of a control unit included in a phase change cooling device according to a third exemplary embodiment of the present invention.

FIG. 10 illustrates a configuration of the control unit 150B included in the phase change cooling device 1300 according to the present exemplary embodiment. The control unit 150B is constituted of a determination unit including a temperature acquisition unit 151 that acquires measurement temperatures from the temperature sensor 300bu and a temperature sensor 300a, a central control unit 152, and a data table 153 as a storage unit, and an output unit including a valve control unit 154 that performs valve control.

Herein, a configuration may be made such that the third temperature sensor 300bu is arranged facing a heat-receiving region of the heat receiving apparatus 100 from which blowing air is discharged, and is located within a ten-percent range from an upper end of the heat-receiving region. In addition, as a determination value, a value obtained by adding an allowable value that is a predetermined constant to a minimum value of a blowing-air temperature difference can be used.

In a cooling device that uses a phase change of a coolant, as in the phase change cooling device 1300 according to the present exemplary embodiment, a location of a temperature sensor is extremely important in order to obtain reliable cooling performance. The reason is as follows. When a temperature sensor is arranged, for example, at a center of a heat receiving apparatus, it can be determined that coolant liquid at an appropriate flow rate is supplied when a measurement value of the temperature sensor is equal to a target value. However, in this case, there is a possibility that, even when the flow rate of the coolant liquid is appropriate at a location within the heat receiving apparatus corresponding to the temperature sensor, the flow rate of the coolant liquid is deficient at a location on a downstream side of the temperature sensor and cooling performance is degraded. However, the phase change cooling device 1300 according to the present exemplary embodiment has a configuration in which the temperature sensor 300bu is arranged on a downstream side of flow of coolant liquid of the heat receiving apparatus 100. Such a configuration makes it possible to perform control in such a way that an upstream side of the location of the temperature sensor 300bu (on a lower side of the heat receiving apparatus 100) entirely performs cooling with use of latent heat. As a result, reliable high-efficiency cooling performance can be obtained.

Figure 11:
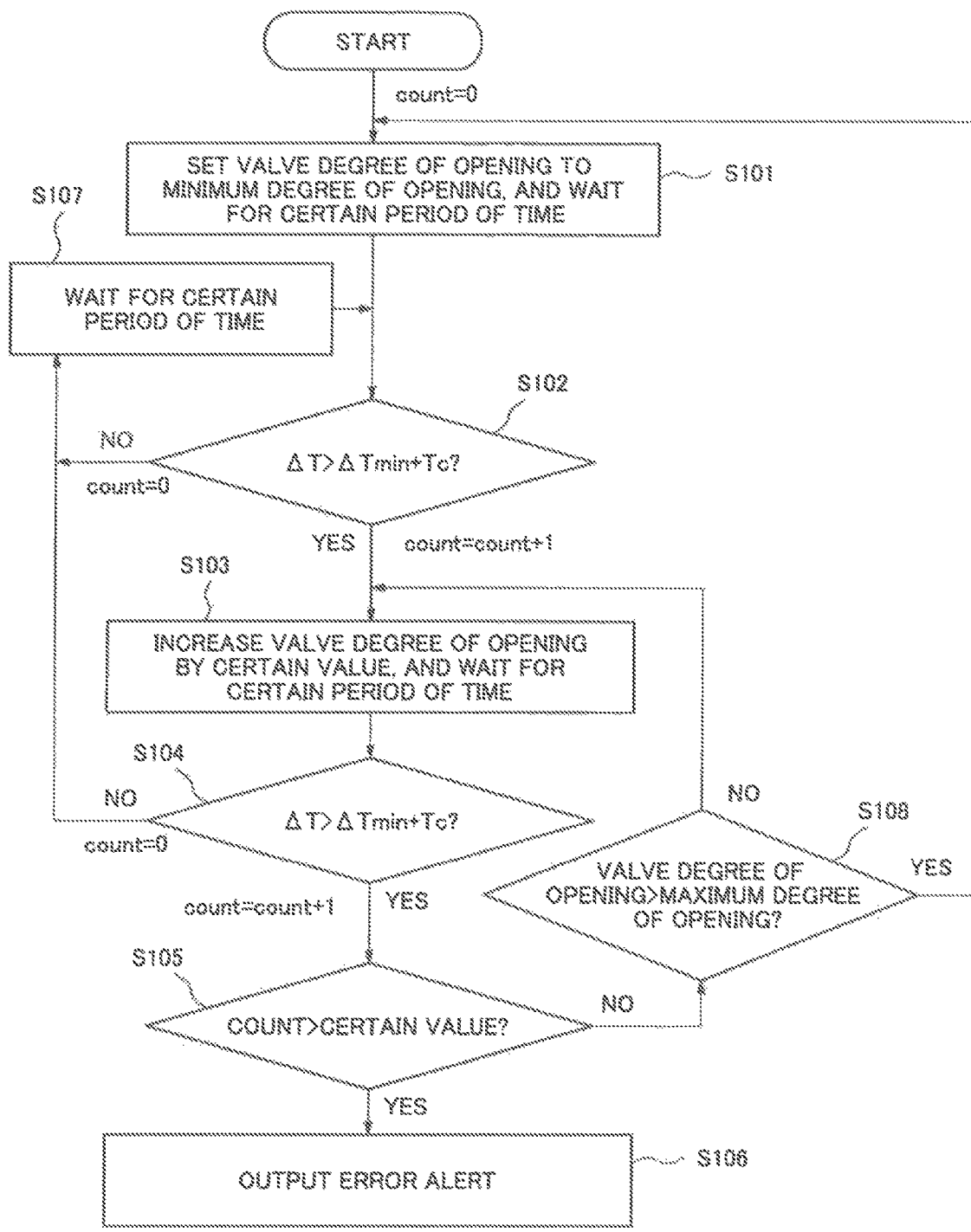
FIG. 11 is a flowchart for describing an operation of the phase change cooling device according to the third exemplary embodiment of the present invention.

Next, an operation of the phase change cooling device 1300 according to the present exemplary embodiment will be described. FIG. 11 is a flowchart for describing an operation of the phase change cooling device 1300 according to the present exemplary embodiment.

First, the control unit 150B starts an operation by setting a count of a counter to zero "0".

The central control unit 152 included in the control unit 150B extracts minimum degree-of-opening data of the valve 400 from the data table 153, and passes the minimum degree-of-opening data to the valve control unit 154. The valve control unit 154 sets a degree of opening of the valve 400 to a minimum degree of opening. Thereafter, the control unit 150B waits for a certain period of time, for example, for about one minute, until circulation of coolant liquid is stabilized (Step S101).

The data table 153 holds setting data such as ΔTmin, Tc, and a minimum degree of opening and a maximum degree of opening of a valve. A minimum degree of opening of a valve can be set to 0% for a configuration having a bypass path in a periphery of the valve 400. However, for a configuration not having a bypass path, coolant liquid does not circulate when a degree of opening of a valve is set to 0%. Thus, in this case, a degree of opening of a valve needs to be set to, for example, 5% and the like.

After waiting for a certain period of time, the temperature acquisition unit 151 acquires data from the temperature sensor 300a and the temperature sensor 300bu. Hereinafter, it is assumed that a measurement value of the temperature sensor 300a is Ta, and a measurement value of the temperature sensor 300bu is Tout.

The central control unit 152 acquires values of Ta and Tout from the temperature acquisition unit 151, calculates ΔT that is a value obtained by subtracting Ta from Tout, and compares magnitude of ΔT with ΔTmin+Tc (Step S102). Herein, Tc is a value that indicates a range allowing degradation of cooling performance, which is acquired from the data table 153.

When ΔT is greater than ΔTmin+Tc (Step S102/YES), the central control unit 152 determines that change of a degree of opening of the valve 400 is necessary. In this case, the central control unit 152 increments the count of the counter by 1, changes the degree of opening of the valve 400 by instructing the valve control unit 154 to increase the degree of opening of the valve by a certain value, for example, by 5%, and waits for a certain period of time (Step S103).

When ΔT is equal to or less than ΔTmin+Tc (Step S102/NO), the central control unit 152 determines that change of a degree of opening of the valve 400 is unnecessary, sets the count of the counter to 0, and waits for a certain period of time (Step S107). Thereafter, the processing returns to Step S102.

After waiting for a certain period of time in Step S103, the central control unit 152 compares magnitude of ΔT with ΔTmin+Tc again (Step S104). At this time, when ΔT is greater than ΔTmin+Tc (Step S104/YES), the central, control unit 152 determines that change of a degree of opening of the valve 400 is necessary. In this case, the central control unit 152 increments the count of the counter by 1, and the processing transitions to Step S105.

In Step S104, when ΔT is equal to or less than ΔTmin+Tc (Step S104/NO), the central control unit 152 determines that change of a degree of opening of the valve 400 is unnecessary. In this case, the central control unit 152 sets the count of the counter to 0, and waits for a certain period of time (Step S107). Thereafter, the processing returns to Step S102.

In Step S104, when the central control unit 152 determines that change of a degree of opening of the valve 400 is necessary (Step S104/YES), the central control unit 152 determines whether or not the count is greater than a certain value, for example, 100 (Step S105).

When the count is greater than a certain value (Step S105/YES), the control unit 150B outputs an error alert (Step S106). This is because the count that is greater than a certain value indicates that a flow rate of coolant liquid has been uncontrolled for a long period of time. Such a phenomenon occurs when a coolant transport amount of a pump is insufficient or excessive, when a degree of opening cannot be adjusted due to occurrence of a trouble in the valve 400, or the like.

When the count is equal to or less than a certain value (Step S105/NO), the central control unit 152 acquires a value of a maximum degree of opening (for example, 95%) of the valve from the data table 153, and compares magnitude of a degree of opening of the valve 400 at a current point of time with the value of the maximum degree of opening (Step S108).

When it is determined that a degree of opening of the valve 400 at a current point of time is greater than the value of the maximum degree of opening (Step S108/YES), the processing transitions to Step S101. On the other hand, when it is determined that a degree of opening of the valve 400 at a current point of time is equal to or less than the value of the maximum degree of opening (Step S108/NO), the processing transitions to Step S103.

With the above-described operation of the control unit 150B included in the phase change cooling device 1300, even when a heat generation quantity of the electronic device 210 varies, the heat receiving apparatus 100 can be supplied with coolant liquid at a necessary flow rate by changing a degree of opening of the valve 400 in accordance with the above-described control method. Therefore, the phase change cooling device 1300 according to the present exemplary embodiment is able to obtain reliable high-efficiency cooling performance, depending on heat exchange performance. In addition, the phase change cooling device 1300 according to the present exemplary embodiment has a configuration including only one temperature sensor 300bu as a temperature sensor for measuring an exhaust air temperature of the heat receiving apparatus 100. Thus, a cost of the phase change cooling device 1300 may be reduced.

Fourth Exemplary Embodiment

Next, a fourth exemplary embodiment according to the present invention will be described. A phase change cooling device 1400 according to the present exemplary embodiment has a configuration including, as a sensor, a fourth temperature sensor 300bd that is located on a lower side of a heat receiving apparatus in a vertical direction.

Figure 12:
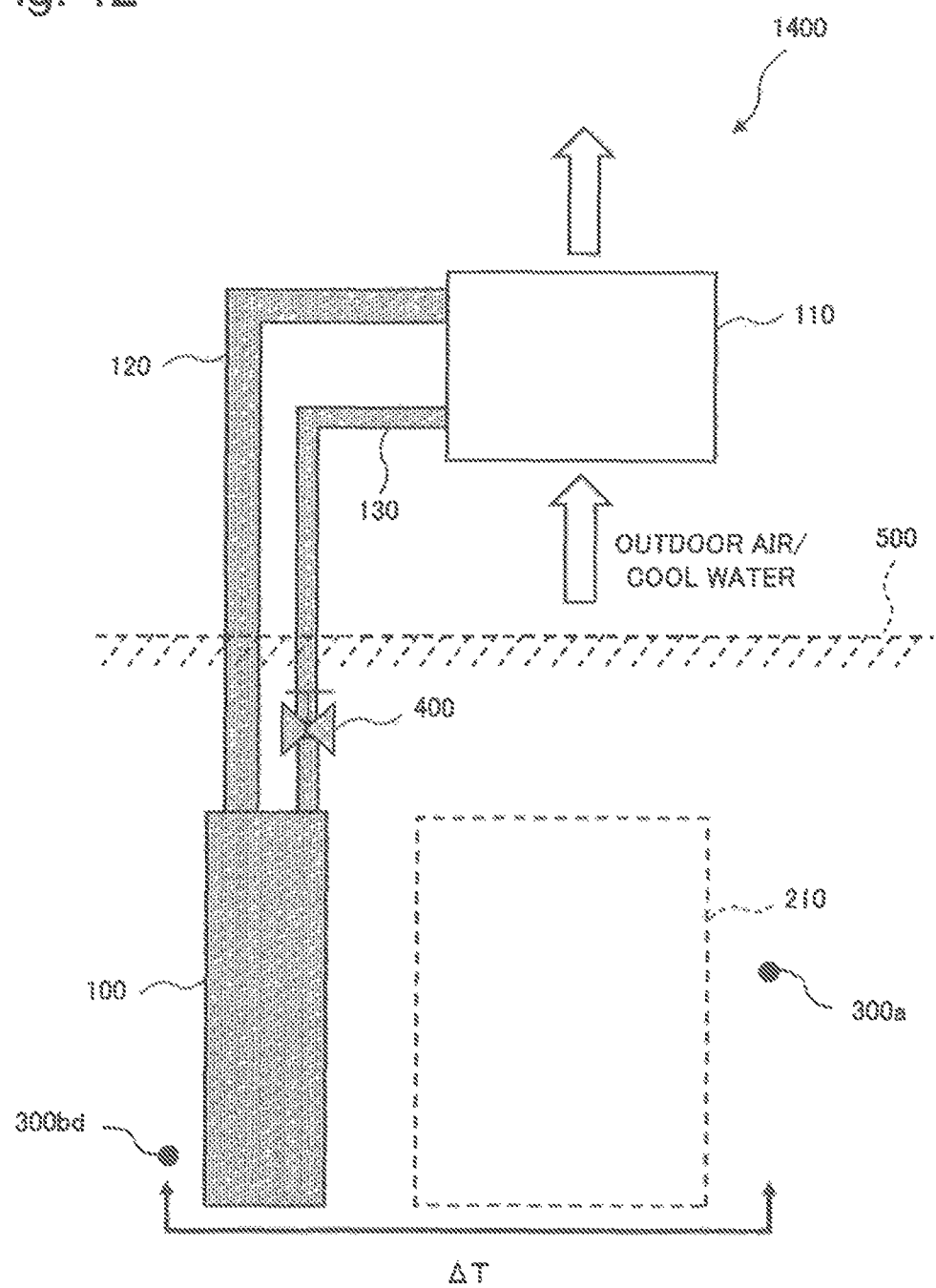
FIG. 12 is a side view schematically illustrating a configuration of a phase change cooling device according to a fourth exemplary embodiment of the present invention.
Figure 13:
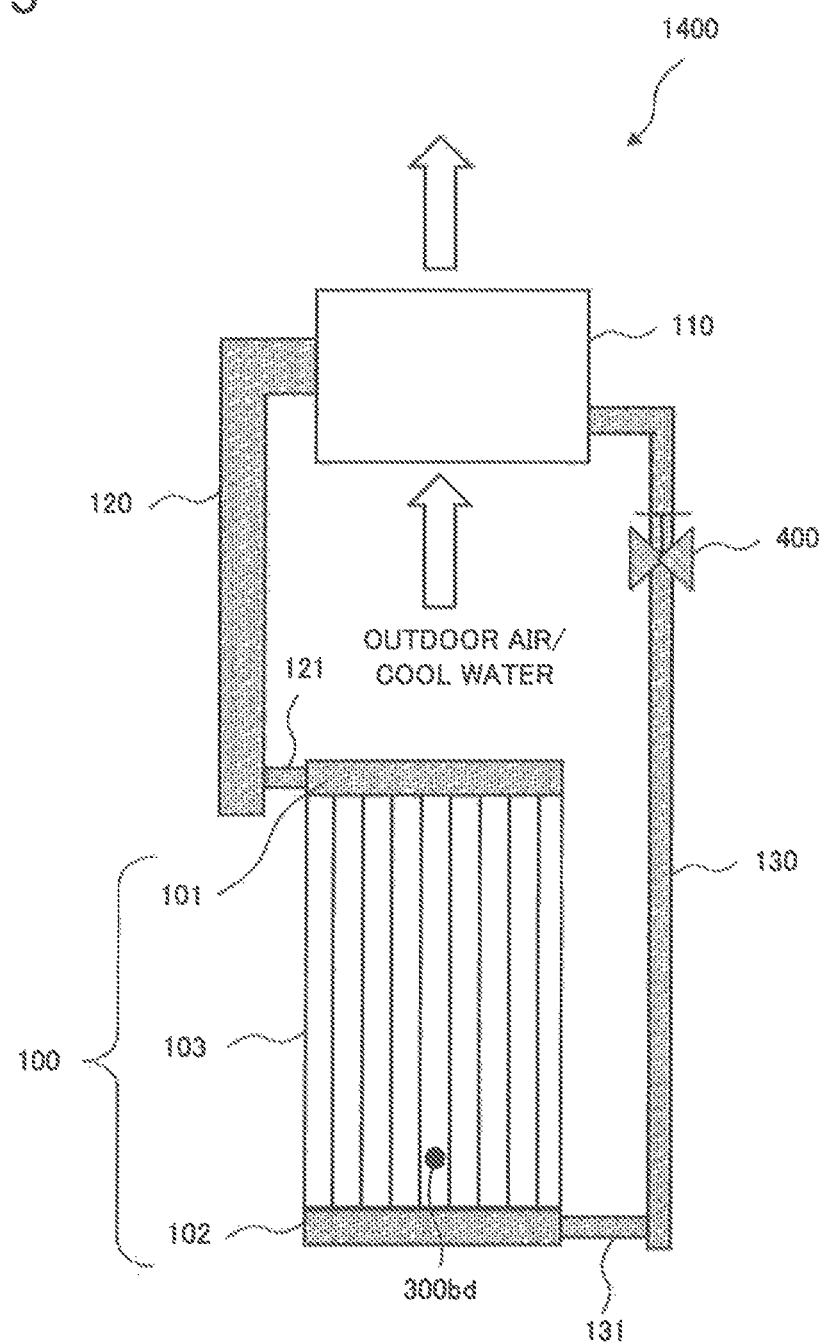
FIG. 13 is a front elevational view schematically illustrating the configuration of the phase change cooling device according to the fourth exemplary embodiment of the present invention.

FIGS. 12 and 13 schematically illustrate a configuration of the phase change cooling device 1400 that uses the fourth temperature sensor 300bd as a sensor. FIG. 12 is a side view, and FIG. 13 is a front elevational view.

As illustrated in FIG. 13, a heat receiving apparatus 100 is configured to flow in coolant liquid from a lower side in a vertical direction, and to flow out coolant vapor from an upper side in a vertical direction.

The fourth temperature sensor 300bd is located on a lower side of the heat receiving apparatus 100 in a vertical direction, and measures a fourth exhaust air temperature that is an exhaust air temperature of the heat receiving apparatus 100. Then, the fourth temperature sensor 300bd outputs the fourth exhaust air temperature as heat receiving apparatus coolant information to a control unit 150C. Note that, in the following description, the fourth temperature sensor 300bd will be simply referred to as a temperature sensor 300bd.

The control unit 150C performs control in such a way that a degree of opening of a valve 400 is stepwisely decreased until a fourth blowing-air temperature difference that is a difference between the fourth exhaust air temperature and a reference temperature becomes equal to or less than a determination value. A configuration of the control unit 150C is the same as the configuration of the control unit 150B included in the phase change cooling device 1300 according to the third exemplary embodiment illustrated in FIG. 10. However, the configuration of the control unit 150C is different in that the temperature acquisition unit 151 included in the control unit 150B acquires a measurement temperature from the temperature sensor 300bd instead of the temperature sensor 300bu.

Figure 14:
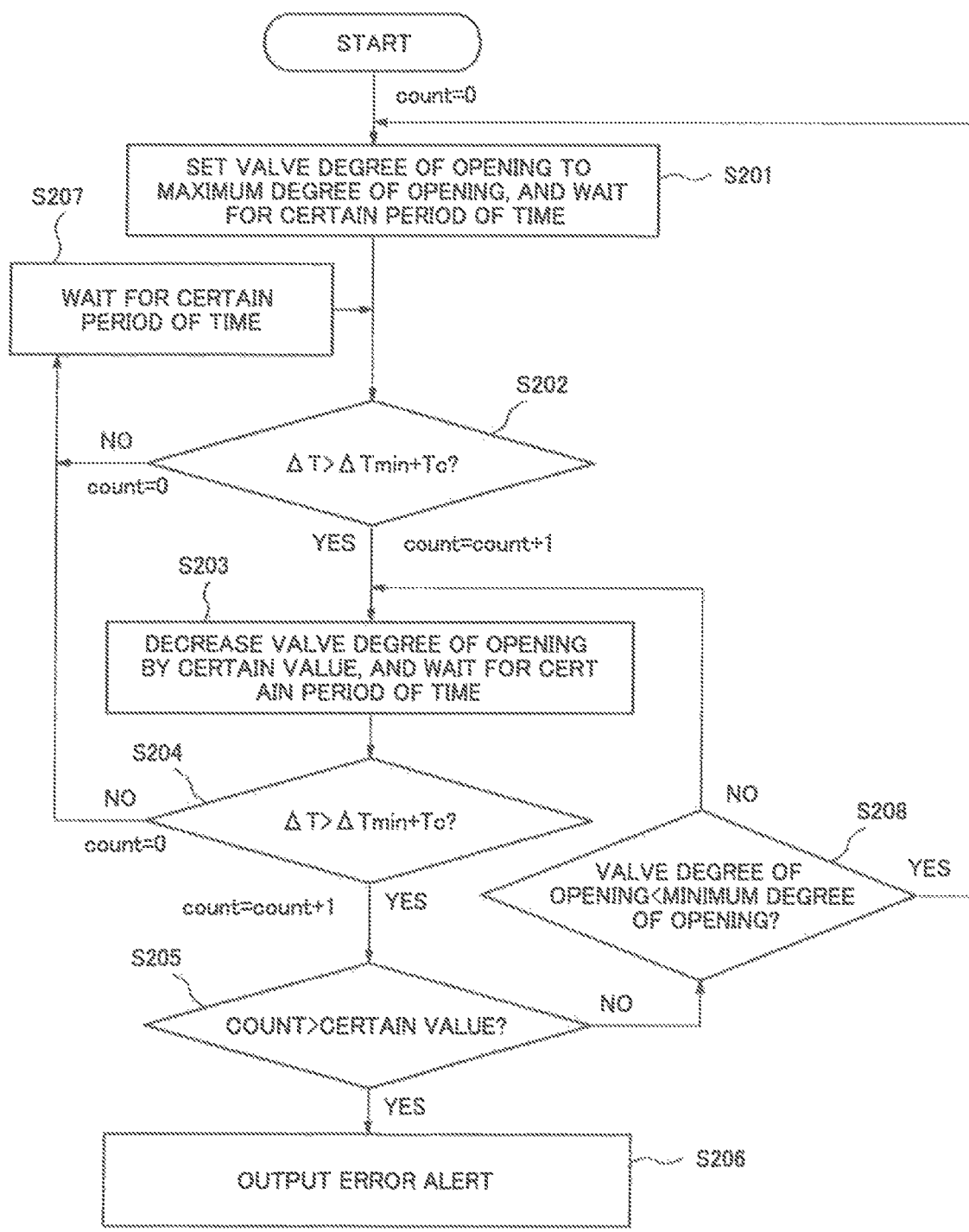
FIG. 14 is a flowchart for describing an operation of the phase change cooling device according to the fourth exemplary embodiment of the present invention.

Next, an operation of the phase change cooling device 1400 according to the present exemplary embodiment will be described. FIG. 14 is a flowchart for describing an operation of the phase change cooling device 1400 according to the present exemplary embodiment.

First, the control unit 150C starts an operation by setting a count of a counter to zero "0".

The central control unit 152 included in the control unit 150C extracts maximum degree-of-opening data of the valve 400 from the data table 153, and passes the maximum degree-of-opening data to the valve control unit 154. The valve control unit 154 sets a degree of opening of the valve 400 to a maximum degree of opening. Thereafter, the control unit 150C waits for a certain period of time, for example, for about one minute, until circulation of coolant liquid is stabilized (Step S201).

The data table 153 holds setting data such as ΔTmin, Tc, and a minimum degree of opening and a maximum degree of opening of a valve. A maximum degree of opening of the valve 400 can be set to, for example, 100%.

After waiting for a certain period of time, the temperature acquisition unit 151 acquires data from the temperature sensor 300a and the temperature sensor 300bd. Hereinafter, it is assumed that a measurement value of the temperature sensor 300a is Ta, and a measurement value of the temperature sensor 300bd is Tout.

The central control unit 152 acquires values of Ta and Tout from the temperature acquisition unit 151, calculates ΔT that is a value obtained by subtracting Ta from Tout, and compares magnitude of ΔT with ΔTmin+Tc (Step S202).

Herein, Tc is a value that indicates a range allowing degradation of cooling performance, which is acquired from the data table 153.

When ΔT is greater than ΔTmin+Tc (Step S202/YES), the central control unit 152 determines that change of a degree of opening of the valve 400 is necessary. In this case, the central control unit 152 increments the count of the counter by 1, changes the degree of opening of the valve 400 by instructing the valve control unit 154 to decrease the degree of opening of the valve by a certain value, for example, by 5%, and waits for a certain period of time (Step S203).

When ΔT is equal to or less than ΔTmin+Tc (Step S202/NO), the central control unit 152 determines that change of a degree of opening of the valve 400 is unnecessary, sets the count of the counter to 0, and waits for a certain period of time (Step S207). Thereafter, the processing returns to Step S202.

After waiting for a certain period of time in Step S203, the central control unit 152 compares magnitude of ΔT with ΔTmin+Tc again (Step S204). At this time, when ΔT is greater than ΔTmin+Tc (Step S204/YES), the central control unit 152 determines that change of a degree of opening of the valve 400 is necessary. In this case, the central control unit 152 increments the count of the counter by 1, and the processing transitions to Step S205.

In Step S204, when ΔT is equal to or less than ΔTmin+Tc (Step S204/NO), the central control unit 152 determines that change of a degree of opening of the valve 400 is unnecessary. In this case, the count of the counter is set to 0, and the processing returns to Step S202 after waiting for a certain period of time (Step S207).

In Step S204, when the central control unit 152 determines that change of a degree of opening of the valve 400 is necessary (Step S204/YES), the central control unit 152 determines whether or not the count is greater than a certain value, for example, 100 (Step S205).

When the count is greater than a certain value (Step S205/YES), the control unit 150C outputs an error alert (Step S206). This is because the count that is greater than a certain value indicates that a flow rate of coolant liquid has been uncontrolled for a long period of time. Such a phenomenon occurs when a coolant transport amount of a pump is insufficient or excessive, when a degree of opening cannot be adjusted due to occurrence of a trouble in the valve 400, or the like.

When the count is equal to or less than a certain value (Step S205/NO), the central control unit 152 acquires a value of a minimum degree of opening (for example, 5%) of the valve from the data table 153, and compares magnitude of a degree of opening of the valve 400 at a current point of time with the value of the minimum degree of opening (Step S208).

When it is determined that a degree of opening of the valve 400 at a current point of time is smaller than the value of the minimum degree of opening (Step S208/YES), the processing transitions to Step S201. On the other hand, when it is determined that a degree of opening of the valve 400 at a current point of time is equal to or greater than the value of the minimum degree of opening (Step S208/NO), the processing transitions to Step S203.

With the above-described operation of the control unit 150C included in the phase change cooling device 1400, even when a heat generation quantity of the electronic device 210 varies, the heat receiving apparatus 100 can be supplied with coolant liquid at a necessary flow rate by changing a degree of opening of the valve 400 in accordance with the above-described control method. Therefore, the phase change cooling device 1400 according to the present exemplary embodiment is able to obtain reliable high-efficiency cooling performance, depending on heat exchange performance. In addition, the phase change cooling device 1400 according to the present exemplary embodiment has a configuration including only one temperature sensor 300bd as a temperature sensor for measuring an exhaust air temperature of the heat receiving apparatus 100. Thus, a cost of the phase change cooling device 1400 may be reduced.

Fifth Exemplary Embodiment

Next, a fifth exemplary embodiment according to the present invention will be described. A phase change cooling device 1500 according to the present exemplary embodiment has a configuration in which a fifth temperature sensor and a sixth temperature sensor are further added to the configuration of the phase change cooling device according to the above-described exemplary embodiment.

Figure 15:
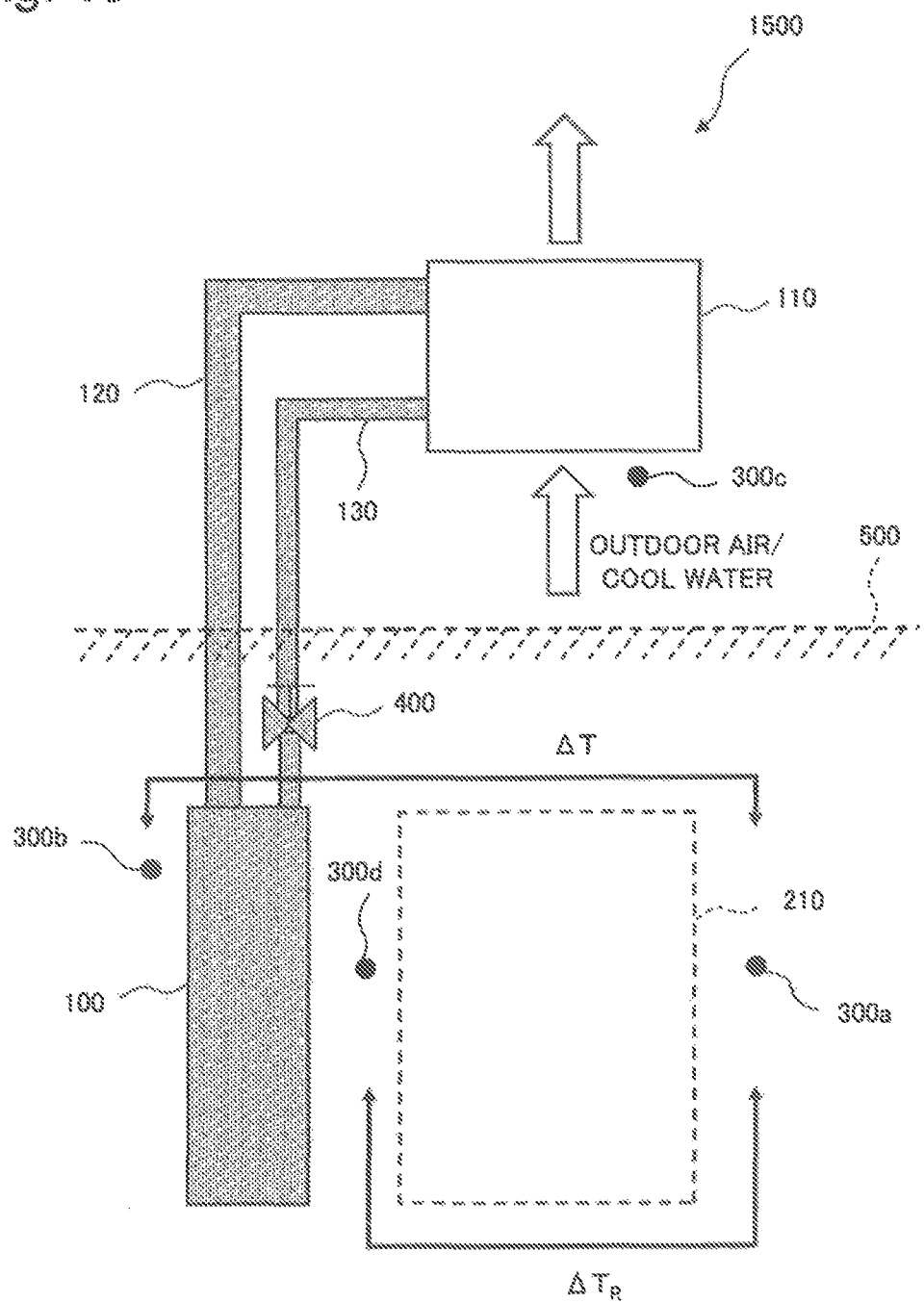
FIG. 15 is a side view schematically illustrating a configuration of a phase change cooling device according to a fifth exemplary embodiment of the present invention.

FIG. 15 is a side view illustrating a configuration of the phase change cooling device 1500 according to the present exemplary embodiment.

A fifth temperature sensor 300c measures a radiator ambient temperature that is a temperature around a radiator 110. A sixth temperature sensor 300d measures an inflow blowing-air temperature that is a temperature of blowing air having passed through an electronic device 210 as a heating element and before flowing into a heat receiving apparatus 100. Note that, in the following description, the fifth temperature sensor 300c and the sixth temperature sensor 300d will be simply referred to as a temperature sensor 300c and a temperature sensor 300d, respectively. In addition, in the present exemplary embodiment, a case will be described in which a configuration is made such that a temperature sensor 300b is located on an upper side of the heat receiving apparatus 100 in a vertical direction (on a downstream side of flow of coolant liquid), similarly to the configuration of the phase change cooling device 1300 according to the third exemplary embodiment.

Herein, when a plurality of temperature sensors 300c are provided, a maximum value of temperatures measured by the plurality of respective temperature sensors 300c may be set as a radiator ambient temperature. In addition, a minimum value or an average value of temperatures measured by the plurality of respective temperature sensors 300c may be set as a radiator ambient temperature.

In addition, when a plurality of temperature sensors 300d are provided, a maximum value of temperatures measured by the plurality of respective temperature sensors 300d may be set as an inflow blowing-air temperature. In addition, a minimum value or an average value of temperatures measured by the plurality of respective temperature sensors 300d may be set as an inflow blowing-air temperature. However, when a maximum value is set as an intake air temperature in the temperature sensor 300a, a maximum value is set as an inflow blowing-air temperature similarly in the temperature sensor 300d, rather than a minimum value or an average value is set as an inflow blowing-air temperature. Likewise, when a minimum value or an average value is set as an intake air temperature in the temperature sensor 300a, a minimum value or an average value is set as an inflow blowing-air temperature similarly in the temperature sensor 300d.

Figure 16:
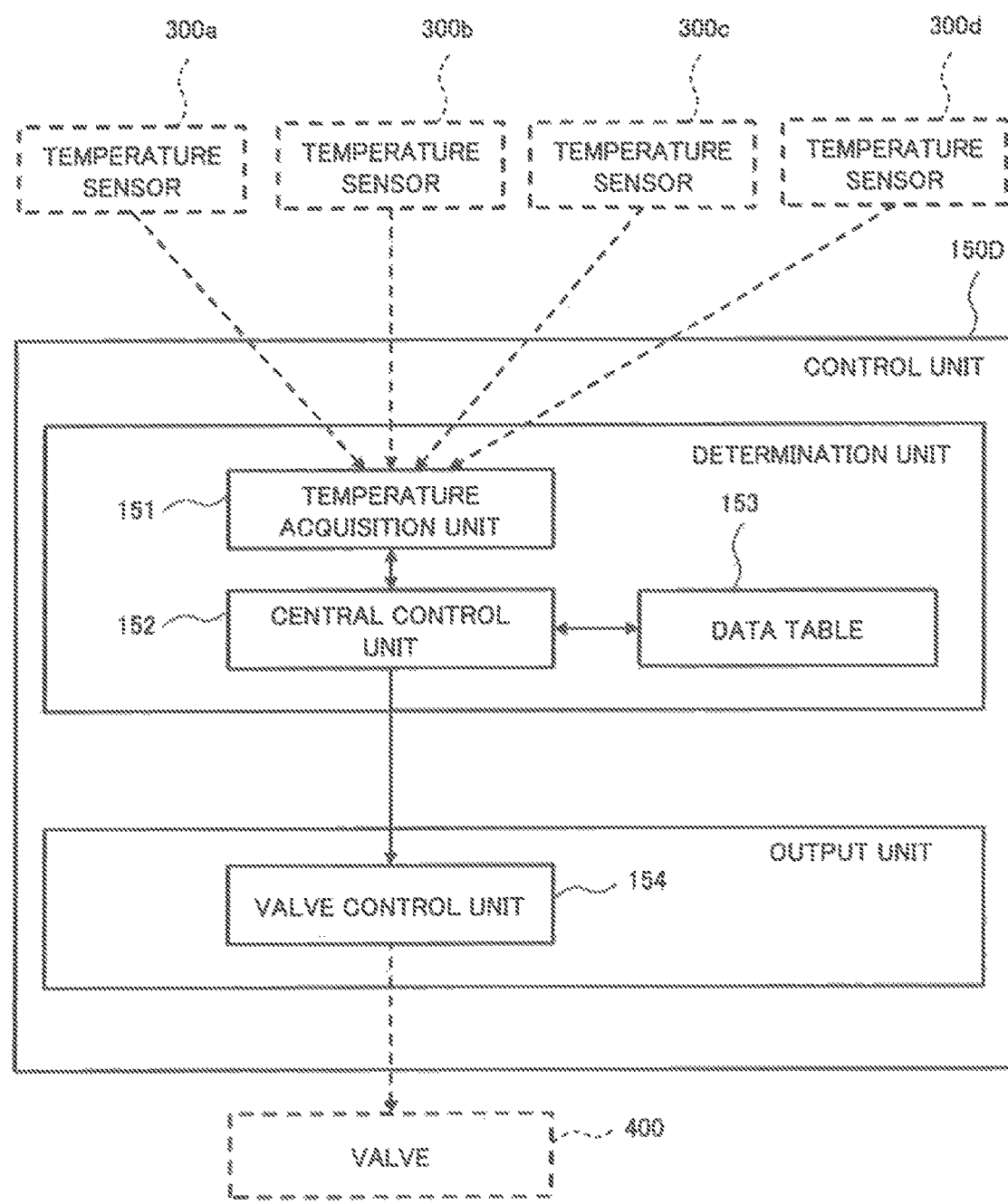
FIG. 16 is a block diagram illustrating a configuration of a control unit included in the phase change cooling device according to the fifth exemplary embodiment of the present invention.

FIG. 16 illustrates a configuration of a control unit 150D included in the phase change cooling device 1500 according to the present exemplary embodiment. The configuration of the control unit 150D is the same as the configuration of the control unit 150B included in the phase change cooling device 1300 according to the third exemplary embodiment. However, the configuration of the control unit 150D is different in that the temperature acquisition unit 151 included in the control unit 150D further acquires a radiator ambient temperature from the temperature sensor 300c, and an inflow blowing-air temperature from the temperature sensor 300d. Then, the control unit 150D calculates a determination value, based on the radiator ambient temperature and the inflow blowing-air temperature.

Next, an operation of the phase change cooling device 1500 according to the present exemplary embodiment will be described. In the following, description will be given with reference to the flowchart for describing the operation of the phase change cooling device 1300 according to the third exemplary embodiment, which is illustrated in FIG. 11.

First, the control unit 150D starts an operation by setting a count of a counter to zero "0".

The central control unit 152 included in the control unit 150D extracts minimum degree-of-opening data of the valve 400 from the data table 153, and passes the minimum degree-of-opening data to the valve control unit 154. The valve control unit 154 sets a degree of opening of the valve 400 to a minimum degree of opening. Thereafter, the control unit 150D waits for a certain period of time, for example, for about one minute, until circulation of coolant liquid is stabilized (Step S101).

The data table 153 holds setting data such as Tc, and a minimum degree of opening and a maximum degree of opening of a valve. A minimum degree of opening of a valve can be set to 0% for a configuration having a bypass path in a periphery of the valve 400. However, for a configuration not having a bypass path, coolant liquid does not circulate when a degree of opening of a valve is set to 0%. Thus, in this case, a degree of opening of a valve needs to be set to, for example, 5% and the like.

After waiting for a certain period of time, the temperature acquisition unit 152 acquires data from the temperature sensor 300a, the temperature sensor 300b, the temperature sensor 300c, and the temperature sensor 300d. Hereinafter, it is assumed that a measurement value of the temperature sensor 300a is Ta, a measurement value of the temperature sensor 300b is Tout, a measurement value of the temperature sensor 300c is To, and a measurement value of the temperature sensor 300d is Tin.

The central control unit 152 acquires values of Ta, Tout, To, and Tin from the temperature acquisition unit 151, calculates ΔT that is a value obtained by subtracting Ta from Tout, and compares magnitude of ΔT with ΔTmin+Tc (Step S102). Herein, Tc is a value that indicates a range allowing degradation of cooling performance, which is acquired from the data table 153.

Herein, the phase change cooling device 1500 according to the present exemplary embodiment has a configuration in which a value of ΔTmin is not stored in the data table 153, but is calculated by the control unit 150D, unlike the phase change cooling device according to the above-described exemplary embodiment.

ΔTmin is defined by Expression (1) below.

$$\Delta T\min = \Delta Tr(1 - \eta \max/100) \tag{1}$$

Herein, ΔTr is a value obtained by subtracting Ta from Tin. ηmax is maximum cooling performance that can be achieved by a cooling system when heat exchange performance of the radiator 110 is given, and is expressed in percentage. The maximum cooling performance is cooling performance that can be achieved by a cooling system when the heat receiving apparatus 100 is supplied with a coolant at a flow rate most appropriate for a heat generation quantity (P) of a heating element, in other words, a necessary coolant flow rate for latent heat. In other words, achievable maximum cooling performance varies depending on heat exchange performance of the radiator 110. The heat exchange performance of the radiator 110 also varies, when an air amount for air cooling of the radiator varies, and the like. In addition, the maximum cooling performance also varies depending on a heat generation quantity of a heating element.

Figure 17:
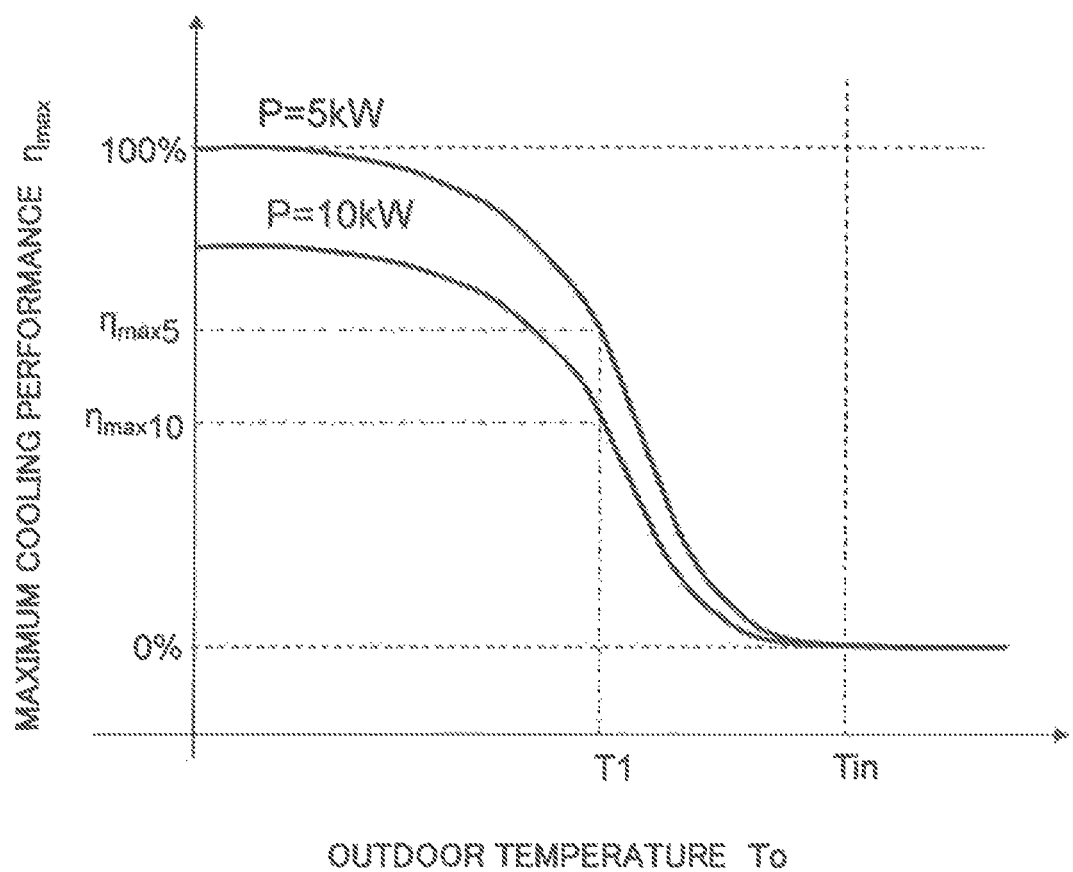
FIG. 17 is a diagram illustrating outdoor temperature dependence of maximum cooling performance in the phase change cooling device according to the fifth exemplary embodiment of the present invention.

FIG. 17 illustrates outdoor temperature To dependence of the maximum cooling performance ηmax when it is assumed that the radiator 110 is an air-cooled radiator. Heat exchange performance of an air-cooled radiator varies depending mainly on a radiator ambient temperature and an air amount for air cooling of the radiator. Herein, when heat is radiated to outdoor air, the radiator ambient temperature is an outdoor temperature. In the following, a case in which heat is radiated to outdoor air will be described. Note that FIG. 17 illustrates outdoor temperature To dependence when an air amount is fixed at a certain value.

When an outdoor temperature To is equal to or greater than Tin, a cooling system not including a compressor and the like is unable to perform heat exchange, and thus, maximum cooling performance becomes zero "0" for any heat generation quantity. On the other hand, the lower the outdoor temperature To is, the higher heat exchange performance of the radiator 110 is, and thus, the maximum cooling performance ηmax is increased. In addition, the more the heat generation quantity P is, the less the maximum cooling performance ηmax is.

Herein, for example, when maximum cooling performance is ηmax10 for a heat generation quantity P of 10 kW and an outdoor temperature of T1, an achievable minimum temperature difference ΔTmin10 can be calculated from the above Expression (1) as in Expression (2) below.

$$\Delta T\min 10 = \Delta Tr(1 - \eta \max 10/100) \tag{2}$$

Figure 18:
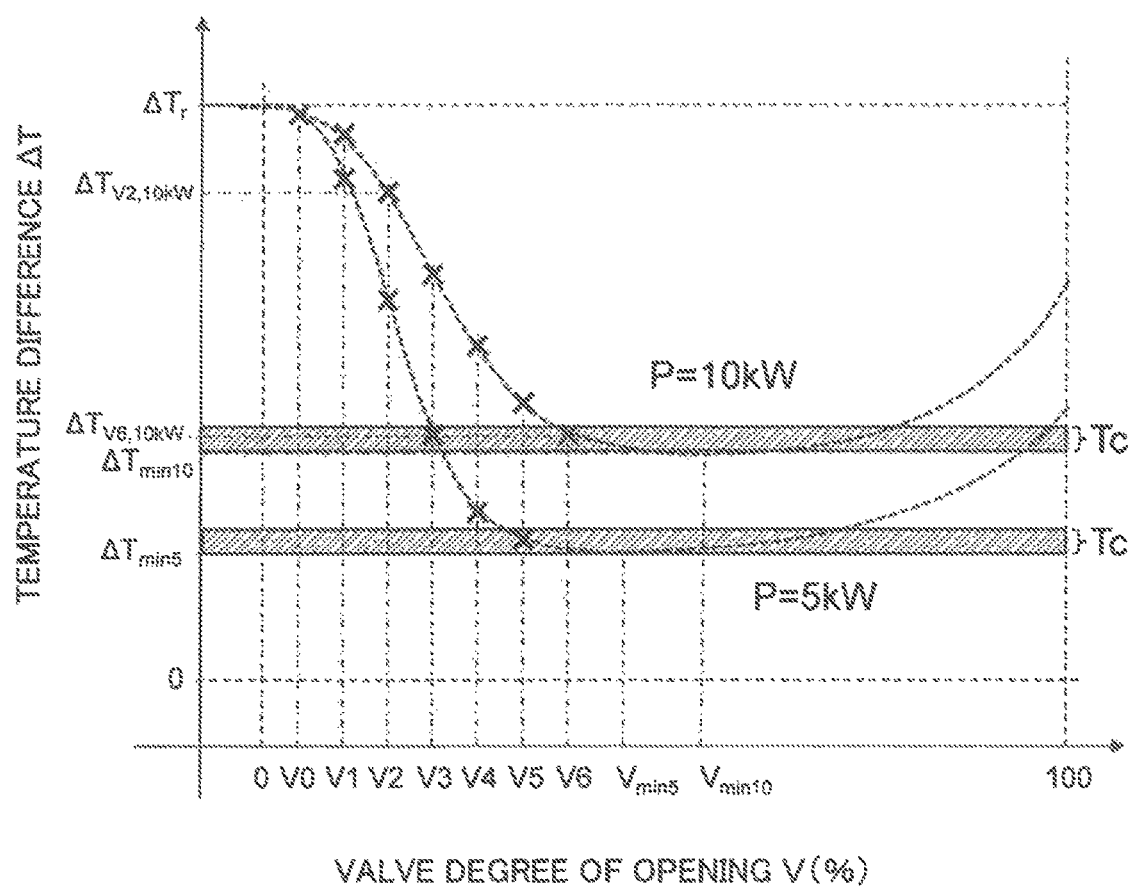
FIG. 18 is a diagram illustrating valve degree of opening dependence of a temperature difference in the phase change cooling device according to the fifth exemplary embodiment of the present invention.

FIG. 18 illustrates valve degree of opening V dependence of a temperature difference ΔT at a fixed air amount Q and an outdoor temperature T1. The valve degree of opening V is defined in percentage. When the valve degree of opening V is 0%, ΔT is equal to ΔTr regardless of the heat generation quantity P. In other words, a value of Tout is equal to a value of Tin, which indicates that the heat receiving apparatus 100 does not absorb heat. This indicates that, since the valve degree of opening V is 0%, there is no circulating coolant and heat cannot be absorbed. On the other hand, when the valve degree of opening V is 100%, liquid cooling is performed, and ΔT becomes smaller than ΔTr yet becomes greater than the minimum temperature difference ΔTmin.

An optimum valve degree of opening, in other words, a value of a degree of opening when a value of ΔT becomes minimum, varies depending on a heat generation quantity. In general, the greater a heat generation quantity is, the larger an optimum valve degree of opening is. This is because, when a heat generation quantity is increased, an optimum coolant flow rate that is a necessary coolant flow rate for latent heat is also increased. For example, when the heat generation quantity P is 5 kW and 10 kW, an optimum valve degree of opening becomes Vmin5 and Vmin10, respectively, and a relationship of Vmin5<Vmin10 holds.

In the following, an operation of the phase change cooling device 1500 will be described by using a case in which the heat generation quantity P is 10 kW and an outdoor temperature is T1 as an example. The achievable minimum temperature difference $\Delta Tmin10$ is calculated from the above Expression (2). Accordingly, the control unit 150D determines, in Step S102, whether or not a value of the temperature difference $\Delta T$ with a valve degree of opening at a current point of time is within a region ($\Delta Tmin10+Tc$) of a slanted line part in FIG. 18.

For example, when a valve degree of opening at a current point of time is V2, $\Delta T$ is $\Delta T_{V2,\ 10\ kW}$ and $\Delta T_{V2,\ 10\ kW}>\Delta Tmin10+Tc$ holds (Step S102/YES), and thus, the control unit 150D determines that change of a degree of opening of the valve 400 is necessary. In this case, the control unit 150D increments a count of a counter by 1, and the processing transitions to Step S103. In addition, for example, when a valve degree of opening at a current point of time is V6, $\Delta T$ is $\Delta T_{V6,\ 10\ kW}$ and $\Delta T_{V6,\ 10\ kW}<\Delta Tmin10+Tc$ holds (Step S102/NO), and thus, the control unit 150D determines that change of a degree of opening of the valve 400 is unnecessary. In this case, the control unit 150D sets the count of the counter to 0, and waits for a certain period of time (Step S107). Thereafter, the processing returns to Step S102.

In this way, the control unit 150D included in the phase change cooling device 1500 according to the present exemplary embodiment calculates $\Delta Tmin$ in Step S102, by using Expression (1) from the maximum cooling performance $\eta max$ at an outdoor temperature at a time of determination. Then, the control unit 150D obtains a value of the temperature difference $\Delta T$ with a valve degree of opening at a time of determination, and determines whether or not change of the valve degree of opening is necessary, by comparing magnitude of $\Delta T$ with $\Delta Tmin+Tc$.

In Step S103, the central control unit 152 changes the degree of opening of the valve 400 by instructing the valve control unit 154 to increase the degree of opening of the valve by a certain value, for example, by 5%, and waits for a certain period of time.

After waiting for a certain period of time, the central control unit 152 compares magnitude of $\Delta T$ with $\Delta Tmin+Tc$ again (Step S104). At this time, when $\Delta T$ is greater than $\Delta Tmin+Tc$ (Step S104/YES), the central control unit 152 determines that change of a degree of opening of the valve 400 is necessary. In this case, the central control unit 152 increments the count of the counter by 1, and the processing transitions to Step S105.

In Step S104, when $\Delta T$ is equal to or less than $\Delta Tmin+Tc$ (Step S104/NO), the central control unit 152 determines that change of a degree of opening of the valve 400 is unnecessary. In this case, the count of the counter is set to 0, and the processing returns to Step S102 after waiting for a certain period of time (Step S107).

In Step S104, when the central control unit 152 determines that change of a degree of opening of the valve 400 is necessary (Step S104/YES), the central control unit 152 determines whether or not the count is greater than a certain value, for example, 100 (Step S105).

When the count is greater than a certain value (Step S105/YES), the control unit 150D outputs an error alert (Step S106). This is because the count that is greater than a certain value indicates that a flow rate of coolant liquid has been uncontrolled for a long period of time. Such a phenomenon occurs when a coolant transport amount of a pump is insufficient or excessive, when a degree of opening cannot be adjusted due to occurrence of a trouble in the valve 400, or the like.

When the count is equal to or less than a certain value (Step S105/NO), the central control unit 152 acquires a value of a maximum degree of opening (for example, 95%) of the valve from the data table 153, and compares magnitude of a degree of opening of the valve 400 at a current point of time with the value of the maximum degree of opening (Step S108).

When it is determined that a degree of opening of the valve 400 at a current point of time is greater than the value of the maximum degree of opening (Step S108/YES), the processing transitions to Step S101. On the other hand, when it is determined that a degree of opening of the valve 400 at a current point of time is equal to or less than the value of the maximum degree of opening (Step S108/NO), the processing transitions to Step S103.

With the above-described operation of the control unit 150D included in the phase change cooling device 1500, even when a heat generation quantity of the electronic device 210 varies, the heat receiving apparatus 100 can be supplied with coolant liquid at a necessary flow rate by changing a degree of opening of the valve 400 in accordance with the above-described control method. Therefore, the phase change cooling device 1500 according to the present exemplary embodiment is able to obtain reliable high-efficiency cooling performance, depending on heat exchange performance.

The present invention has been described by using each of the exemplary embodiments described above as an exemplary example. However, the present invention is not limited to the above-described exemplary embodiments. In other words, various modes that a person skilled in the art can understand can be applied to the present invention within the scope of the present invention.

This application is based upon and claims the benefit of priority from Japanese Patent Application No. 2015-059180, filed on Mar. 23, 2015, the disclosure of which is incorporated herein in its entirety.

REFERENCE SIGNS LIST 10, 1100, 1200, 1300, 1400, 1500 Phase change cooling device
11, 100 Heat receiving apparatus
12 Sensor
13, 110 Radiator
14, 400 Valve
15, 150A, 150B, 150D Control unit
16, 120 Vapor pipe
17, 130 Liquid pipe
21 Heating element
101 Upper header
102 Lower header
103 Tube
121 Vapor branch pipe
131 Liquid branch pipe
151 Temperature acquisition unit
152 Central control unit
153 Data table
154 Valve control unit
210 Electronic device
300a, 300b, 300b1, 302b2, 300bu, 300bd, 300c, 300d Temperature sensor
500 Ceiling

The invention claimed is:
1. A phase change cooling device comprising:
a heat receiver that houses a coolant;
at least one sensor that acquires heat receiver coolant information relating to a liquid-gas two-phase flow interface of the coolant housed in the heat receiver, wherein the at least one sensor includes a first tem- perature sensor that measures an exhaust air temperature of blowing air passing through a heating element as an object to be cooled, the exhaust air temperature being measured after being discharged from the heat receiver;
a radiator that radiates heat of coolant vapor of the coolant evaporated in the heat receiver, and recirculates liquefied coolant liquid to the heat receiver;
a valve that controls a flow rate of the coolant liquid; and
a controller that controls a degree of opening of the valve, wherein
the controller controls, based on the heat receiver coolant information, the degree of opening of the valve such that the liquid-gas two-phase flow interface of the coolant is located at an end part of the heat receiver in a vertical direction,
wherein the controller, when the heat receiver coolant information comprises a blowing-air temperature difference that is a difference between the exhaust air temperature and a reference temperature, and the blowing-air temperature difference is equal to or less than a determination value that is determined based on heat exchange performance of the heat receiver and the radiator, determines that the liquid-gas two-phase flow interface of the coolant is located at the end part of the heat receiver in the vertical direction.

2. The phase change cooling device according to claim 1, wherein
the heat receiver is configured to flow in the coolant liquid from a lower side, and to flow out the coolant vapor from an upper side,
the at least one sensor includes a second temperature sensor,
the first temperature sensor is located on the upper side of the heat receiver, measures a first exhaust air temperature that is the exhaust air temperature of the heat receiver, and outputs the first exhaust air temperature as the heat receiver coolant information to the controller,
the second temperature sensor is located on the lower side of the heat receiver, measures a second exhaust air temperature that is the exhaust air temperature of the heat receiver, and outputs the second exhaust air temperature as the heat receiver coolant information to the controller, and
the controller controls the degree of opening of the valve such that both a first blowing-air temperature difference that is a difference between the first exhaust air temperature and the reference temperature, and a second blowing-air temperature difference that is a difference between the second exhaust air temperature and the reference temperature, become equal to or less than the determination value.

3. The phase change cooling device according to claim 1, wherein
the heat receiver is configured to flow in the coolant liquid from the lower side, and to flow out the coolant vapor from the upper side,
the at least one sensor includes a second temperature sensor that is located on the upper side of the heat receiver,
the second temperature sensor measures a third exhaust air temperature that is the exhaust air temperature of the heat receiver, and outputs the third exhaust air temperature as the heat receiver coolant information to the controller, and
the controller performs control such that the degree of opening of the valve is stepwisely increased until a third blowing-air temperature difference that is a difference between the third exhaust air temperature and the reference temperature becomes equal to or less than the determination value.

4. The phase change cooling device according to claim 2, wherein
the first temperature sensor is arranged facing a heat-receiving region of the heat receiver from which the blowing air is discharged and are located within a ten-percent range from an upper end of the heat-receiving region.

5. The phase change cooling device according to claim 1, wherein
the heat receiver is configured to flow in the coolant liquid from the lower side, and to flow out the coolant vapor from the upper side,
the at least one sensor includes is a second temperature sensor that is located on the lower side of the heat receiver,
the second temperature sensor measures a fourth exhaust air temperature that is the exhaust air temperature of the heat receiver, and outputs the fourth exhaust air temperature as the heat receiver coolant information to the controller, and
the controller performs control in such a way that the degree of opening of the valve is stepwisely decreased until a fourth blowing-air temperature difference that is a difference between the fourth exhaust air temperature and the reference temperature becomes equal to or less than the determination value.

6. The phase change cooling device according to claim 2, wherein
the second temperature sensor is arranged facing a heat-receiving region of the heat receiver from which the blowing air is discharged and are located within a ten-percent range from a lower end of the heat-receiving region.

7. The phase change cooling device according to claim 2, further comprising
a third temperature sensor that measures a radiator ambient temperature that is a temperature around the radiator, and a fourth temperature sensor that measures an inflow blowing-air temperature that is a temperature of the blowing air having passed through the heating element and before flowing into the heat receiver, wherein
the controller calculates the determination value, based on the radiator ambient temperature and the inflow blowing-air temperature.

8. The phase change cooling device according to claim 1, wherein
the controller includes a memory that stores a minimum value of the blowing-air temperature difference.

9. The phase change cooling device according to claim 1, wherein
the reference temperature is a temperature of the blowing air before passing through the heating element.

10. The phase change cooling device according to claim 1, wherein
the determination value is a value obtained by adding an allowable value that is a predetermined constant to a minimum value of the blowing-air temperature difference.

11. The phase change cooling device according to claim 1, wherein
the heat receiver is constituted of a plurality of heat receiver arranged in the vertical direction, and a plurality of the first sensors and a plurality of the valves are provided corresponding to each of the plurality of heat receivers.

\* \* \* \* \*